United States Patent
Adachi et al.

[11] Patent Number: 6,081,541
[45] Date of Patent: Jun. 27, 2000

[54] SEMICONDUCTOR LASER DEVICE AND OPTICAL DISK APPARATUS USING THE SAME

[75] Inventors: Hideto Adachi, Mino; Satoshi Kamiyama, Sanda; Isao Kidoguchi, Mino; Takeshi Uenoyama, Kyoto; Masaya Mannoh, Hirakata; Toshiya Fukuhisa, Kyoto, all of Japan

[73] Assignee: Matsushita Electric Industrial Co., Ltd., Osaka, Japan

[21] Appl. No.: 09/349,747

[22] Filed: Jul. 8, 1999

Related U.S. Application Data

[63] Continuation of application No. 08/732,279, Oct. 30, 1996.

[30] Foreign Application Priority Data

Mar. 31, 1995 [JP] Japan .................................. 7-075451
May 17, 1995 [JP] Japan .................................. 7-118154

[51] Int. Cl.⁷ ........................................................ H01S 3/19
[52] U.S. Cl. .............................................. 372/45; 372/46
[58] Field of Search ........................................ 372/45, 46

[56] References Cited

U.S. PATENT DOCUMENTS

| | | | |
|---|---|---|---|
| 4,435,809 | 3/1984 | Tsang et al. | 372/45 |
| 4,961,197 | 10/1990 | Tanaka et al. | 372/45 |
| 5,003,549 | 3/1991 | Mitsui et al. | 372/46 |
| 5,053,356 | 10/1991 | Mitsui et al. | 438/40 |
| 5,214,663 | 5/1993 | Kakimoto et al. | 372/45 |
| 5,416,790 | 5/1995 | Yodoshi | 372/46 |
| 5,506,170 | 4/1996 | Yodoshi et al. | 438/40 |
| 5,581,570 | 12/1996 | Yosida et al. | 372/46 |
| 5,751,756 | 5/1998 | Takayama et al. | 372/46 |

FOREIGN PATENT DOCUMENTS

| | | |
|---|---|---|
| 0477013 | 3/1992 | European Pat. Off. . |
| 0555097 | 8/1993 | European Pat. Off. . |
| 4119921 | 6/1991 | Germany . |
| 60-008761 | 1/1985 | Japan . |
| 60-241285 | 11/1985 | Japan . |
| 62-97389 | 5/1987 | Japan . |
| 63-202083 | 8/1988 | Japan . |
| 63-257286 | 10/1988 | Japan . |
| 6449295 | 2/1989 | Japan . |
| 3089581 | 8/1989 | Japan . |
| 02086183 | 3/1990 | Japan . |
| 02228087 | 9/1990 | Japan . |
| 5136529 | 6/1993 | Japan . |
| 05327131 | 12/1993 | Japan . |
| 6196810 | 7/1994 | Japan . |
| 6260716 | 9/1994 | Japan . |
| 7022695 | 1/1995 | Japan . |
| 07263794 | 10/1995 | Japan . |
| 2265755 | 10/1993 | United Kingdom . |
| 9220128 | 11/1992 | WIPO . |

OTHER PUBLICATIONS

International Search Report for Application PCT/JP96/00801, dated Mar. 27, 1996.
Office Action for Japanese Patent Application Serial No. 8–529169, dated Sep. 22, 1998.

*Primary Examiner*—James W. Davie
*Attorney, Agent, or Firm*—Renner, Otto, Boisselle & Sklar LLP

[57] ABSTRACT

A semiconductor laser device of the present invention includes a substrate 201 made of n-type GaAs, an active layer 204, and a pair of cladding layers sandwiching the active layer 204. The device further includes a spacer layer 205 adjacent to the active layer 204 and a highly doped saturable absorbing layer 206. The carrier life time is shortened by doping the saturable absorbing layer 206 in a high concentration, whereby stable self-sustained pulsation can be obtained. As a result, a semiconductor laser device can be obtained, which has a low relative noise intensity in a wide range of temperatures.

6 Claims, 30 Drawing Sheets

1605 Strained quantum well saturable absorbing layer

PRIOR ART

| Spacer thickness (Å) | 100 | 200 | 300 | 400 | 500 | 600 |
|---|---|---|---|---|---|---|
| Self-sustained pulsation | × | ○ | ○ | ○ | ○ | ○ |

SEMICONDUCTOR LASER DEVICE AND OPTICAL DISK APPARATUS USING THE SAME

This is a continuation, of application Ser. No. 08/732,279, filed Oct. 30, 1996.

TECHNICAL FIELD

The present invention relates to a low noise self-sustained pulsation type semiconductor laser device used as a light source for an optical disk system, etc.

BACKGROUND ART

In recent years, semiconductor laser devices (laser diodes) are in increasing demand in the fields such as optical communication, laser printers, and optical disks. Under these circumstances, active research and development have been conducted with respect to various semiconductor laser devices with particular emphasis on those of GaAS type and InP type. In the field of optical information processing, systems for recording and reproducing information by using 780 nm-band AlGaAs type laser diodes as light sources have been put into practical use. Such systems became widespread for use with recording and reproducing compact disks.

However, recently, the increase in storage capacity of these optical disks has come to be strongly demanded. Along with this, it has come to be required to obtain semiconductor laser devices capable of emitting laser light with shorter wavelengths.

AlGaInP type semiconductor laser devices are capable of allowing laser oscillation to be realized at wavelengths of 630 nm to 690 nm in the red region. In the present specification, $(Al_xGa_{1-x})_{0.5}In_{0.5}P$ ($0 \leq x<1$) is abbreviated simply as "AlGaInP". At present, of various practical semiconductor laser devices, the AlGaInP type semiconductor laser devices are capable of emitting laser light with the shortest wavelengths, so that they hold great promise as next-generation large capacity light sources for optical information recording, in place of AlGaAs type semiconductor laser devices which have been widely used in the past.

For evaluation of semiconductor laser devices, intensity noise and temperature characteristics are important elements in addition to wavelengths of laser light. In particular, when a semiconductor laser device is used as a light source for reproducing optical disks, small intensity noise is very important. This is because intensity noise induces errors while signals recorded on an optical disk are read. The intensity noise of the semiconductor laser device is caused not only by changes in temperature of the device but also by light partially reflected from the surface of the optical disk to the semiconductor laser device. Thus, semiconductor laser devices, which have small intensity noise even when reflected light is fed back to the devices, are indispensable as light sources for reproducing optical disks.

Conventionally, in the case of using AlGaAs type semiconductor laser devices as low output light sources dedicated for reproducing optical disks, saturable absorbers are intentionally formed on both sides of ridge stripes in the devices so as to reduce noise. The use of such a structure enables a longitudinal mode of laser oscillation to be multiple. When the feedback of laser light to a device, the changes in temperature of the device, etc., are caused while laser oscillation is realized in a single longitudinal mode, a slight change in gain peak allows laser oscillation to start in another longitudinal mode close to the longitudinal mode in which the laser oscillation has already been realized. This causes mode competition between the new longitudinal mode and the original longitudinal mode, resulting in noise. Thus, in the case of multiple longitudinal modes, the changes in intensity of each mode are averaged and the intensity of each mode does not change due to the feed-back of laser light to the device, the changes in temperature of the device, etc. This permits stable low noise characteristics to be obtained.

Japanese Laid-Open Patent Publication No. 63-202083 discloses a semiconductor laser device capable of obtaining stable self-sustained pulsation characteristics. According to this publication, a self-sustained pulsation type laser diode is realized by providing a layer capable of absorbing light generated in an active layer.

Furthermore, Japanese Laid-Open Patent Publication No. 6-260716 discloses that the characteristics of red semiconductor laser devices are improved by rendering a bandgap of an active layer almost equal to that of an absorbing layer. FIG. 1 is a schematic cross-sectional view of a conventional self-sustained pulsation type semiconductor laser device disclosed in Japanese Laid-Open Patent Publication No. 6-260716. Hereinafter, this semiconductor laser device will be described with reference to FIG. 1.

Referring to FIG. 1, a buffer layer 1602 made of n-type GaInP, a cladding layer 1603a made of n-type AlGaInP, a strained quantum well saturable absorbing layer 1605a, a cladding layer 1603b made of n-type AlGaInP, a strained quantum well active layer 1604 made of GaInP, a cladding layer 1603c made of n-type AlGaInP, and a strained quantum well saturable absorbing layer 1605b are successively formed on a substrate 1601 made of n-type GaAs. A cladding layer 1606 and a contact layer 1607 made of p-type GaInP are formed respectively in a ridge shape on the strained quantum well saturable absorbing layer 1605b. Both sides of the cladding layer 1606 and the contact layer 1607 are buried with a current blocking layer 1608 made of n-type GaAs. Furthermore, a cap layer 1609 made of p-type GaAs is formed on the contact layer 1607 and the current blocking layer 1608. A p-type electrode 1610 is formed on the cap layer 1609 and an n-type electrode 1611 is formed on a reverse surface of the substrate 1601.

FIG. 2 shows an energy band of the strained quantum well saturable absorbing layers 1605a and 1605b. In the strained quantum well saturable absorbing layers 1605a and 1605b, barrier layers 1701 made of $(Al_{0.7}Ga_{0.3})_{0.5}In_{0.5}P$, and well layers 1702 made of $Ga_xIn_{1-x}P$ (film thickness: 100 Å; strain: +0.5% to 1.0%) are alternately layered. In this example, three well layers 1702 are layered. Herein, the bandgap of the strained quantum well active layer 1604 is prescribed to be almost equal to that of the strained quantum well saturable absorbing layers 1605a and 1605b. In the conventional example, an attempt is made to obtain satisfactory self-sustained pulsation characteristics by using this structure.

Compared with the AlGaAs type semiconductor devices, the AlGaInP type semiconductor devices are not likely to allow self-sustained pulsation to be realized. This is attributable to the big difference in gain characteristics therebetween. FIG. 3 shows the dependency of a gain on a carrier density with respect to GaInP and GaAs, which are mainly used for active layers of the AlGaAs type semiconductor devices and the AlGaInP type semiconductor devices, respectively.

In order to attain self-sustained pulsation, it is required that the rate increase of a gain (i.e., a slope of a gain curve)

with respect to a carrier density is large. However, it was found to be relatively difficult in attaining self-sustained pulsation with GaInP because the slope of its gain curve is smaller than that of the gain curve of GaAs.

Furthermore, according to the experimental result of the inventors of the present invention, the following was found: In the case of red semiconductor laser devices (AlGaInP type semiconductor laser devices), because of the gain characteristics it is still difficult to obtain stable self-sustained pulsation merely by rendering the bandgap of an active layer equal to that of a saturable absorbing layer, as in the conventional example.

The present invention has been achieved in view of the above-mentioned points, and its objective is to provide a highly reliable semiconductor laser device having stable self-sustained pulsing characteristics, in particular, by appropriately prescribing the doping degree and thickness of a saturable absorbing layer and a spacer layer forming a semiconductor laser.

DISCLOSURE OF THE INVENTION

According to one aspect of the present invention, a self-sustained pulsation type semiconductor laser device is provided, which includes an active layer and a cladding structure sandwiching the active layer, wherein the cladding structure includes a saturable absorbing layer doped with an impurity in a concentration of $1 \times 10^{18}$ cm$^{-3}$ or more, and the saturable absorbing layer is provided at a position away from the active layer.

In one embodiment of the present invention, an interval between the saturable absorbing layer and the active layer is 200 Å or more.

In another embodiment of the present invention, the cladding structure further includes a spacer layer having a bandgap larger than bandgaps of the active layer and the saturable absorbing layer between the active layer and the saturable absorbing layer.

In another embodiment of the present invention, the spacer layer has a thickness of 200 Å or more.

In another embodiment of the present invention, an impurity concentration of a region with a thickness of at least 200 Å of the spacer layer adjacent to the active layer is $0.7 \times 10^{18}$ cm$^{-3}$ or less.

In another embodiment of the present invention, the spacer layer is almost uniformly doped with an impurity in a concentration of $0.7 \times 10^{18}$ cm$^{-3}$ or less.

In another embodiment of the present invention, the saturable absorbing layer has an impurity concentration which is locally higher than an impurity concentration of a portion of the cladding structure adjacent to the saturable absorbing layer.

In another embodiment of the present invention, an impurity with which the saturable absorbing layer is doped is a p-type.

In another embodiment of the present invention, the cladding structure further includes an optical guide layer having a bandgap smaller than a bandgap of the spacer layer between the active layer and the saturable absorbing layer.

In another embodiment of the present invention, the cladding structure further includes an optical guide layer, and the saturable absorbing layer is provided adjacent to the optical guide layer.

In another embodiment of the present invention, the cladding structure further includes an optical guide layer, and the saturable absorbing layer is provided in the optical guide layer.

In another embodiment of the present invention, the cladding structure further includes an optical guide layer, and the saturable absorbing layer is provided in the vicinity of the optical guide layer.

In another embodiment of the present invention, the above-mentioned self-sustained pulsation type semiconductor laser device includes a current confinement layer doped with an n-type impurity and a p-type impurity.

In another embodiment of the present invention, the above-mentioned self-sustained pulsation type semiconductor laser device includes: a spacer layer made of a material with a bandgap larger than a bandgap of the active layer between the active layer and the saturable absorbing layer; at least two quantum well layers made of a material with a bandgap smaller than a bandgap of the spacer layer; and a quantum barrier layer made of a material with a bandgap larger than a bandgap of the quantum well layers, provided between the quantum well layers.

In another embodiment of the present invention, a current blocking layer with conductivity different from conductivity of the cladding layer is provided adjacent to the cladding layer, and width of a region through which a current is injected into the cladding layer is 7 µm or less.

In another embodiment of the present invention, a structure blocking diffusion of carriers into the saturable absorbing layer is provided in a region adjacent to the saturable absorbing layer.

Alternatively, a self-sustained pulsation type semiconductor laser device is provided, which includes an active layer and a cladding structure sandwiching the active layer, wherein the cladding structure includes a saturable absorbing layer doped with an impurity in a concentration of $1 \times 10^{18}$ cm$^{-3}$ or more and an optical guide layer provided in the vicinity of the saturable absorbing layer; the saturable absorbing layer being provided at a position away from the active layer.

In one embodiment of the present invention, the active layer has a quantum well structure, and the saturable absorbing layer is formed of a quantum well layer.

In another embodiment of the present invention, the cladding structure includes a p-type cladding layer and an n-type cladding layer, and the saturable absorbing layer is a p-type and is provided in the p-type cladding layer.

In another embodiment of the present invention, the cladding structure further includes a spacer layer with a bandgap larger than bandgaps of the active layer and the saturable absorbing layer between the active layer and the saturable absorbing layer.

In another embodiment of the present invention, the spacer layer has a thickness of 200 Å or more.

In another embodiment of the present invention, an impurity concentration of the spacer layer is $1 \times 10^{18}$ cm$^{-3}$ or less.

Alternatively, a self-sustained pulsation type semiconductor laser device is provided which includes an active layer and a cladding structure sandwiching the active layer, wherein a part of the active layer functions as a saturable absorbing region, and the saturable absorbing region is doped with an impurity in a concentration of $1 \times 10^{18}$ cm$^{-3}$ or more.

In another embodiment of the present invention, an impurity of the saturable absorbing layer is a p-type.

In another embodiment of the present invention, the saturable absorbing region is provided at a position adjacent to a current injection region of the active layer.

Alternatively, a self-sustained pulsation type semiconductor laser device is provided, which includes an active layer and a saturable absorbing layer, wherein a carrier lifetime in the saturable absorbing layer is 6 nanoseconds or less.

In one embodiment of the present invention, the saturable absorbing layer is doped with a p-type impurity.

In another embodiment of the present invention, the saturable absorbing layer is doped with a p-type impurity and an n-type impurity.

According to another aspect of the present invention, a method for producing a self-sustained pulsation type semiconductor laser device is provided, which includes the steps of: forming a cladding structure including a saturable absorbing layer; exposing a part of the saturable absorbing layer by partially removing the cladding structure; selectively removing the exposed portion of the saturable absorbing layer with gas having an etching function; and forming a carrier diffusion blocking layer, using the gas as a material.

Alternatively, a method for producing a self-sustained pulsation type semiconductor laser device including an active layer and a cladding structure sandwiching the active layer is provided. The cladding structure includes a saturable absorbing layer doped with a p-type impurity in a concentration of $1 \times 10^{18}$ cm$^{-3}$ or more. The saturable absorbing layer is provided at a position away from the active layer, and the device has characteristics which vary with time after commencement of laser oscillation, and become almost constant characteristics after a lapse of about one minute. The method includes a stabilization step of: allowing the characteristics of the device to be varied immediately after commencement of the laser oscillation so as to obtain almost constant characteristics.

In one embodiment of the present invention, the characteristics are current-light output characteristics.

In another embodiment of the present invention, the stabilization step includes the step of reducing a threshold current by an aging processing.

In another embodiment of the present invention, the stabilization step includes the step of reducing a threshold current by annealing.

In another embodiment of the present invention, a threshold current is reduced by 25 mA or more from a value immediately after commencement of the laser oscillation during the stabilization step.

According to another aspect of the present invention, an optical disk apparatus is provided which includes a semiconductor laser device, a converging optical system converging laser light emitted from the semiconductor laser device into a recording medium, and a light detector detecting laser light reflected from the recording medium. The semiconductor laser device is a self-sustained pulsation type semiconductor laser device including an active layer and a cladding structure sandwiching the active layer, the cladding structure including a saturable absorbing layer doped with an impurity in a concentration of $1 \times 10^{18}$ cm$^{-3}$ or more, the saturable absorbing layer being positioned away from the active layer.

In one embodiment of the present invention, the semiconductor laser device realizes laser oscillation in a single mode when recording information in the recording medium, and operates in a self-sustained pulsation mode when reproducing information recorded in the recording medium.

In another embodiment of the present invention, the light detector is provided in the vicinity of the semiconductor laser device.

In another embodiment of the present invention, the light detector has a plurality of photodiodes formed on a silicon substrate, and the semiconductor laser device is provided on the silicon substrate.

In another embodiment of the present invention, the silicon substrate has a concave portion formed on a principal plane thereof and a micromirror formed on one side of the concave portion of the silicon substrate. The semiconductor laser device is provided in the concave portion of the silicon substrate, and an angle formed by the micromirror and the principal plane is set so that laser light emitted from the semiconductor laser device travels in a direction approximately perpendicular to the principal plane of the silicon substrate after being reflected from the micromirror.

In another embodiment of the present invention, a metal film is formed on a surface of the micromirror.

In another embodiment of the present invention, the active layer and the cladding structure are made of an $Al_xGa_yIn_{1-x-y}P$ ($0 \leq x \leq 1, 0 \leq y \leq 1$, where x and y are not zero simultaneously) material.

In another embodiment of the present invention, the saturable absorbing layer is provided only on a selected region of the spacer layer.

BEST MODE FOR CARRYING OUT THE INVENTION

Figure 1:
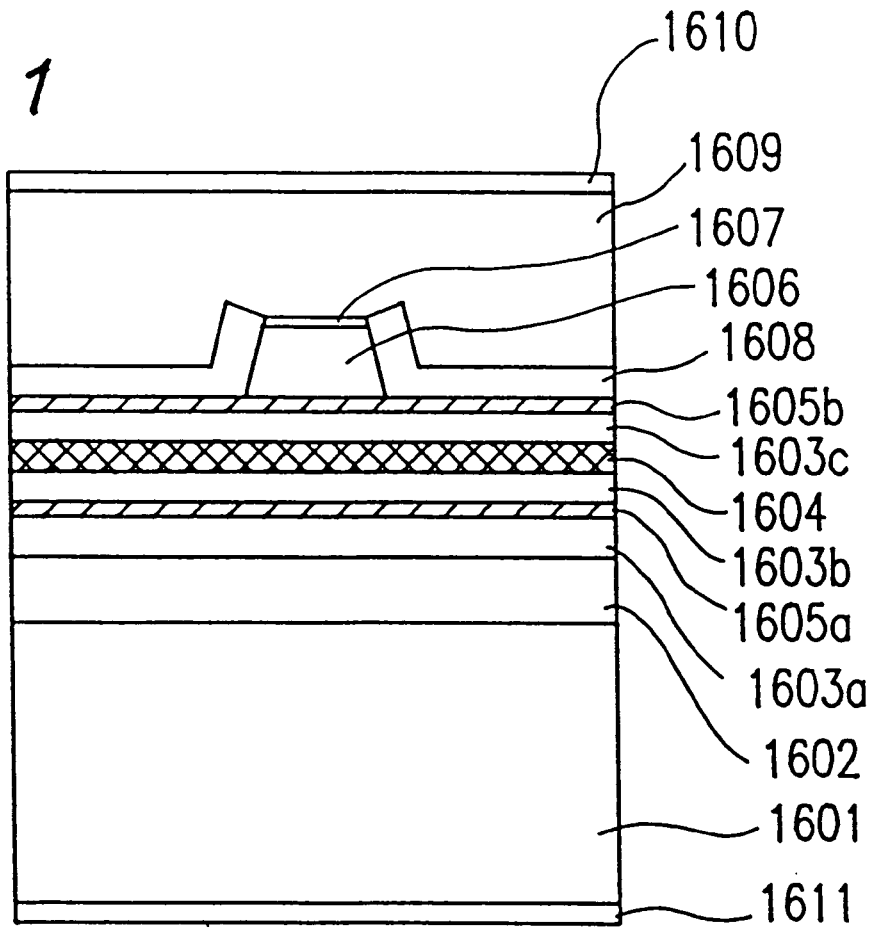
FIG. 1 is a cross-sectional view of a semiconductor laser device in a conventional example.

In the semiconductor laser device of the present invention, the carrier lifetime in a saturable absorbing layer is decreased to 6 nanoseconds or less by regulating the doping level of the saturable absorbing layer. Consequently, the contribution of spontaneous emission increases with respect to the change ratio of a carrier density with time, whereby self-sustained pulsation can be easily realized and relative noise can be lowered.

In the conventional semiconductor laser device, the doping level in the vicinity of an active laser is less than $1 \times 10^{18}$ cm$^{-3}$, so that the carrier lifetime in the saturable absorbing layer is long, which leads to difficulty in self-sustained pulsation. According to the study by the inventors of the present invention, the reason for this is as follows: In the case where the carrier lifetime is long, the contribution of spontaneous emission decreases with respect to the change ratio of a carrier density with time, and it becomes difficult for the carrier density to be vibrated. Hereinafter, this will be described in more detail.

The rate equations for a semiconductor laser device provided with a saturable absorbing layer are represented as follows:

$$\frac{dS}{dt} = [\Gamma_1 g_1 + \Gamma_2 g_2(n_2, p) - g_{th}]s + \quad (1)$$

$$\beta_{sp1} \frac{n_1 V_1}{\tau_1(n_1)} + \beta_{sp2} \frac{n_2 V_2}{\tau_2(n_2, p)}$$

$$\frac{dn_1}{dt} = -\frac{\Gamma_1}{V_1} g_1(n_1)s - \frac{n_1}{\tau_1(n_1)} + \frac{I}{eV_1} \quad (2)$$

$$\frac{dn_2}{dt} = -\frac{\Gamma_2}{V_2} g_2(n_2, p)s - \frac{n_2}{\tau_2(n_1, p)} \quad (3)$$

where S denotes a total photon number; n denotes an electron density; $\Gamma$ denotes an optical confinement factor; p denotes a hole density; $\beta_{sp}$ denotes a spontaneous emission coefficient; V denotes a volume, $\tau$ denotes a carrier lifetime; g denotes a gain; and I denotes an injected current density. The suffixes 1 and 2 correspond to an active layer and a saturable absorbing layer, respectively.

Before a current is injected into the active layer, each term of the equations (1) to (3) is zero. Once a current starts being injected into the active layer, the terms in the equations regarding the current become large, so that $dn_1/dt$ becomes positive. This means that an electron density $n_1$ in the active layer increases.

The increase in the electron density $n_1$ leads to the increase in photon number by the spontaneous emission and the increase in photon number by the gain. Therefore, $dS/dt$ increases, resulting in the increase in the total photon number S. The increase in the total photon number S increases the absolute value of the first term of the equation (2), so that $dn_1/dt$ decreases, resulting in the decrease in the electron density $n_1$.

A gain $g_2$ in the first term of the equation (3) initially has a negative value. Because of this, the right side of the equation (3) becomes positive, and an electron density $n_2$ in the saturable absorbing layer increases. When the saturable absorbing layer absorbs a certain amount of light, the gain $g_2$ becomes positive.

When the gain $g_2$ becomes positive, $dn_2/dt$ starts decreasing and becomes negative.

In order to realize self-sustained pulsation, it is required to largely vibrate the total photon number S, and the electron densities $n_1$ and $n_2$. In order to cause such vibration, the optical confinement factor $\Gamma$ can be increased or volumes $V_1$ and $V_2$ of each layer can be decreased. However, according to the experimentation by the inventors, self-sustained pulsation was not realized even when the optical confinement factor $\Gamma$ was increased or the volumes $V_1$ and $V_2$ of each layer was decreased.

The inventors focused attention on a carrier lifetime $\tau_2$ in the saturable absorbing layer, generally dealt as a constant. The inventors found through various analyses and experiments that self-sustained pulsation is realized when the carrier lifetime $\tau_2$ in the saturable absorbing layer has an appropriate value (6 nanoseconds or less). The inventors also found that the carrier lifetime $\tau_2$ in the saturable absorbing layer can be set to be the above-mentioned appropriate value by setting the doping level of the saturable absorbing layer at an appropriate value (i.e., $1\times10^{18}$ cm$^{-3}$ or more).

Figure 4:
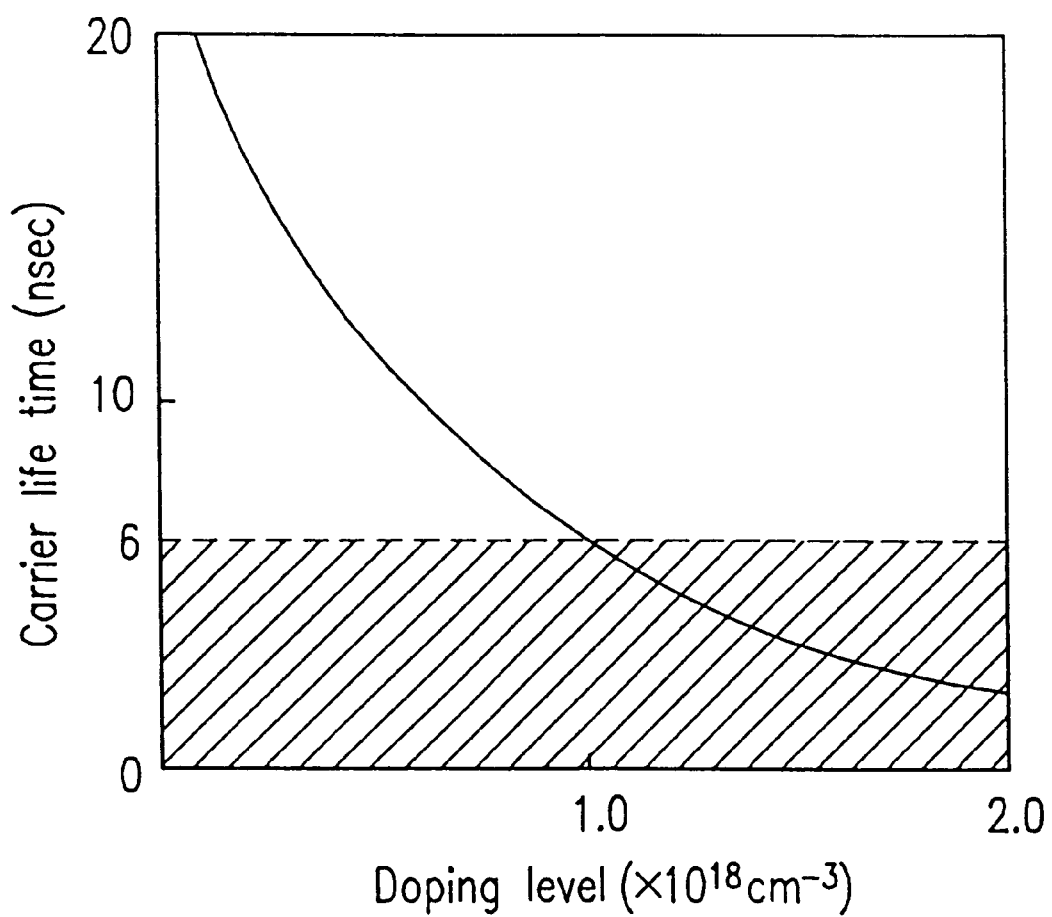
FIG. 4 is a graph showing the dependency of a carrier lifetime on a doping level in the saturable absorbing layer.

FIG. 4 is a graph showing the changes in the carrier lifetime $\tau_2$ with respect to the doping level of the saturable absorbing layer doped with a p-type impurity. It is understood from this graph that the carrier lifetime $\tau_2$ greatly changes depending upon the doping level. The shape of a curve in this graph does not depend upon the kind of a p-type impurity.

As described above, the impurity doping level in the vicinity of the active layer is set at a low value so as to be less than $1\times10^{18}$ cm$^{-3}$. The reason for this is to prevent the reliability of a laser device from decreasing due to the diffusion of an impurity into the active layer. However, the carrier lifetime $\tau_2$ is too long at an impurity doping level of less than $1\times10^{18}$ cm$^{-3}$, so that self-sustained pulsation cannot be realized.

As described above, according to the experiment by the inventors, it was found that the carrier lifetime $\tau_2$ is desirably about 6 nanoseconds or less. In the graph of FIG. 4, a region where the carrier lifetime $\tau_2$ is 6 nanoseconds or less is shaded. As is apparent from FIG. 4, the carrier lifetime $\tau_2$ becomes long at a low doping level. The carrier lifetime $\tau_2$ exceeds 6 nanoseconds at a doping level of less than $1\times10^{18}$ cm$^{-3}$. In contrast, the carrier lifetime $\tau_2$ can be decreased to about 3 nanoseconds by increasing the doping level to $1\times10^{18}$ cm$^{-3}$ or more, e.g., about $2\times10^{18}$ cm$^{-3}$.

The above-mentioned Japanese Laid-Open Patent Publication No. 6-260716 does not describe doping. Japanese Laid-Open Patent Publication No. 6-260716 describes that self-sustained pulsation is realized merely by introducing a saturable absorbing layer having a bandgap equivalent to that of an active layer into cladding layers provided on both sides of the active layer. However, the inventors of the present invention found it difficult to realize self-sustained pulsation type laser devices merely by introducing such a saturable absorbing layer into cladding layers.

As described above, it was found from the experiment by the inventors that self-sustained pulsation of light output is not likely to be realized at a general doping level in the range of $1\times10^{17}$ cm$^{-3}$ to $1\times10^{18}$ cm$^{-3}$.

In order to realize self-sustained pulsation at a general doping level, a method for sufficiently decreasing the volume V of the saturable absorbing layer and relatively increasing carrier density as other parameters is considered. However, in order to decrease the volume of the saturable absorbing layer, the layer needs to be made thinner. Light confinement in the saturable absorbing layer decreases along with the decrease in volume of the saturable absorbing layer. For this reason, light absorption ratio decreases, making it difficult to obtain a semiconductor laser having desired self-sustained pulsation characteristics.

Thus, in order to obtain stable self-sustained pulsation, it is very effective to prescribe the carrier lifetime $\sigma_2$ in the saturable absorbing layer at an appropriate value (6 nanoseconds or less) by setting the doping level of the saturable absorbing layer at an appropriate value.

There are some points to be noted in the case of increasing the doping level of the saturable absorbing layer.

In general, it is known that the doping level of, for example, a p-type impurity in AlGaInP can be increased by using a substrate with its principal plane tilted from a (100) plane to a [011] direction (off-substrate). However, it was found from experimentation by the inventors of the present invention that the reliability of semiconductor laser devices decreases when a highly doped layer is positioned close to an active layer. This is attributable to the diffusion of a p-type dopant, Zn. Thus, as far as reliability is concerned, it is not necessarily sufficient merely to increase the doping level of the saturable absorbing layer. The problem caused by a highly doped saturable absorbing layer is solved by inserting a spacer layer at a relatively low doping level, e.g., about $5\times10^{17}$ cm$^{-3}$. This will be described in more detail by way of illustrative examples.

In the semiconductor laser device of the present invention, in order to compensate for the decrease in light confinement coefficient when the saturable absorbing layer is used as a quantum well, an optical guide layer is provided at a position adjacent to the saturable absorbing layer or in the vicinity of the saturable absorbing layer, whereby the effect of light absorption by the saturable absorbing layer is sufficiently exerted. Consequently, it is possible to obtain stable self-sustained pulsation characteristics.

Hereinafter, the semiconductor laser device of the present invention will be described by way of illustrative examples with reference to the drawings.

EXAMPLE 1

Figure 5:
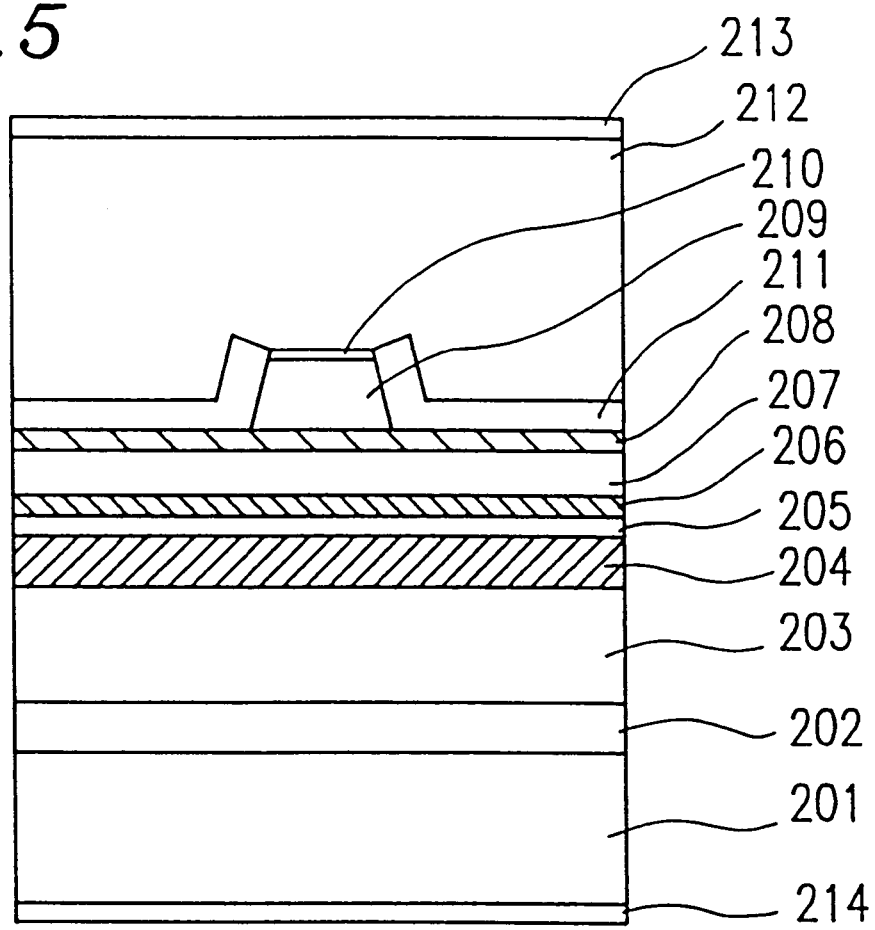
FIG. 5 is a cross-sectional view of an AlGaInP type semiconductor laser in the first example according to the present invention.

FIG. 5 shows a cross-sectional structure of a semiconductor laser device of the first example according to the present invention.

The semiconductor laser device includes an n-type GaAs substrate 201 and a semiconductor multi-layer structure formed on the GaAs substrate 201. The semiconductor layer structure includes an n-type GaAs buffer layer 202, an n-type AlGaInP cladding layer 203, a multi-quantum well active layer 204 made of AlGaInP and GaInP, a p-type AlGaInP spacer layer 205, a p-type GaInP highly doped saturable absorbing layer 206, a first p-type AlGaInP cladding layer 207, a p-type GaInP etching stopping layer 208, and a second p-type AlGaInP cladding layer 209.

The second p-type AlGaINP cladding layer 209 has a stripe shape (width: about 2.0 to 7.0 $\mu$m) extending in the cavity length direction.

A contact layer 210 is formed on the upper surface of the second p-type cladding layer 209. An n-type GaAs current blocking layers 211 is formed on both sides of the second p-type cladding layer 209 and the contact layer 210. A p-type GaAs cap layer 212 is formed on the contact layer 210 and the current blocking layer 211. A p-type electrode 213 is formed on the upper surface of the cap layer 212, and an n-type electrode 214 is formed on the reverse surface of the substrate 201. The active layer 204 has a multi-quantum well structure made of 3 well layers and 3 barrier layers.

In the present specification, the rest portion of the semiconductor layer structure, excluding the buffer layer, the active layer, the contact layer, the cap layer, and the current blocking layer from the semiconductor layer structure; is referred to as a "cladding structure". In the present example, the n-type AlGaInP cladding layer 203, the highly doped saturable absorbing layer 206, the p-type GaInP etching stopping layer 208, the first p-type AlGaInP cladding layer 207, and the second p-type AlGaInP cladding layer 209 form the cladding structure.

When a voltage is applied across the p-type electrode 213 and n-type electrode 214 to allow a current (driving current) to flow from the p-type electrode 213 to the n-type electrode 214 in order to realize laser oscillation, the current is blocked by the current blocking layer 211 so as to flow through the contact layer 210 and the second p-type cladding layer 209. This allows the current to flow through a region (current injection region) of the active layer 204 immediately below the second p-type cladding layer 209 and does not allow the current to flow through a region immediately below the current blocking layer 211. Light is generated in the current injection region of the active layer 204 and diffuses outside of the current injection region to a certain degree. This light partially interacts with the saturable absorbing layer 206, thereby realizing self-sustained pulsation.

The doping level and thickness of each semiconductor layer forming the layer structure of the present invention are as follows:

TABLE 1

| Name | No. | Doping level | Thickness |
|---|---|---|---|
| cap layer | ...212 | $5 \times 10^{18}$ (cm$^{-3}$) | 3 µm |
| contact layer | ...210 | $1 \times 10^{18}$ (cm$^{-3}$) | 500 Å |
| second p-type cladding layer | ...209 | $1 \times 10^{18}$ (cm$^{-3}$) | 0.9 µm |
| etching stopping layer | ...208 | $5 \times 10^{17}$ (cm$^{-3}$) | 100 Å |
| first p-type cladding layer | ...207 | $5 \times 10^{17}$ (cm$^{-3}$) | 1350 Å |
| highly doped saturable absorbing layer | ...206 | $2 \times 10^{18}$ (cm$^{-3}$) | 150 Å |
| spacer layer | ...205 | $5 \times 10^{17}$ (cm$^{-3}$) | 900 Å |
| active layer | ...204 | undoped | 500 Å |
| n-type cladding layer | ...203 | $5 \times 10^{17}$ (cm$^{-3}$) | 1.0 µm |
| buffer layer | ...202 | $1 \times 10^{18}$ (cm$^{-3}$) | 0.3 µm |

Figure 6:
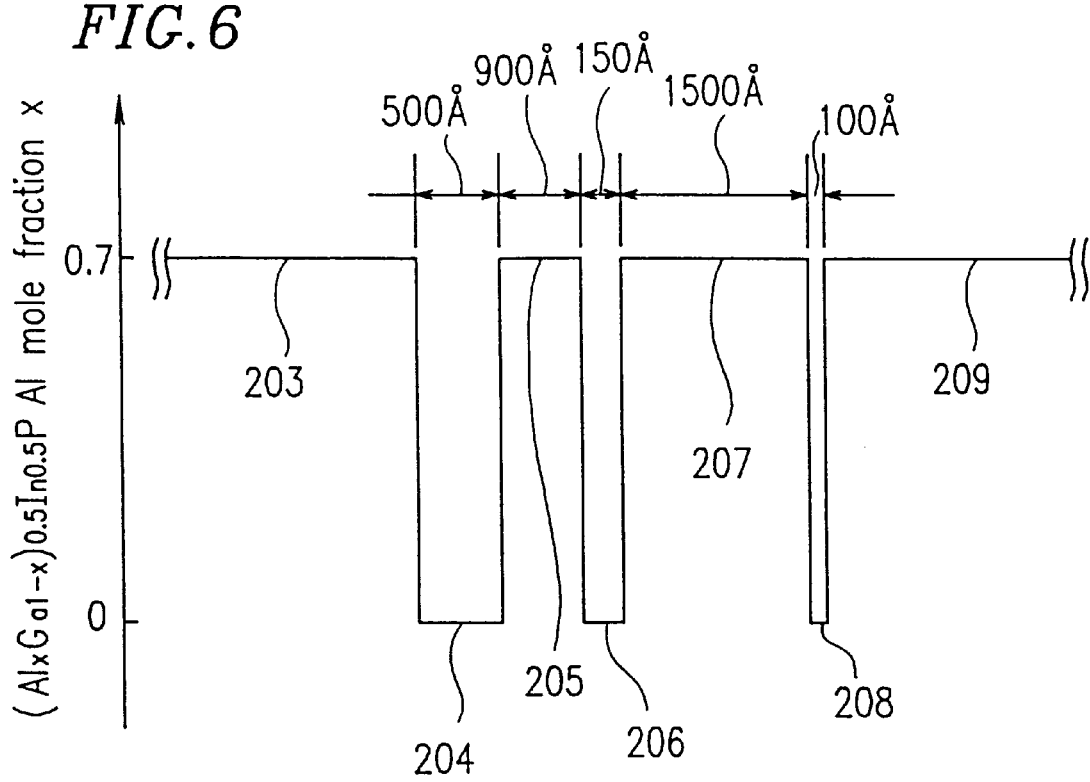
FIG. 6 is a diagram showing an Al mole fraction in the vicinity of an active layer in the first example according to the present invention.

FIG. 6 shows a profile of an Al mole fraction x of $(Al_xGa_{1-x})_{0.5}In_{0.5}P$ ($0 \leq x < 1$) in the vicinity of the active layer of the present example. In the present example, the Al mole fraction x of the n-type cladding layer 203, the spacer layer 205, the first p-type cladding layer 207, and the second p-type cladding layer 209 are 0.7. However, the Al mole fraction x of these layers is not limited to 0.7. The Al mole fractions x of the n-type cladding layer 203, the spacer layer 205, the first p-type cladding layer 207, and the second p-type cladding layer 209 can be different from each other. Furthermore, the Al mole fractions x can change in stages or continuously in the respective layers.

As shown in FIG. 6, the saturable absorbing layer 206 of the present examples is inserted in a position away from the active layer 204 in the p-type portion of the cladding structure. A portion positioned between the active layer 204 and the saturable absorbing layer 206 in the cladding structure is called the spacer layer 205 in the present specification.

The thickness of the spacer layer 205 of the present example is 900 Å. The spacer layer 205 prevents the impurity with which the saturable absorbing layer 206 is doped in a high concentration from diffusing into the active layer 204 to degrade the reliability of the device. The preferable thickness and impurity concentration of the spacer layer 205 will be described later.

The thickness of the saturable absorbing layer 206 of the present example is 150 Å. The saturable absorbing layer with thickness equal to or more than 150 Å does not have a quantum well structure, so that a quantum level is not formed in the saturable absorbing layer. When the saturable absorbing layer 206 is thick, in other words, the saturable absorbing layer 206 has a large volume, the carrier density therein becomes small. Therefore, the carrier lifetime is not shortened, making it difficult to allow self-sustained pulsation to be realized. Considering this point, the thickness of the saturable absorbing layer is preferably less than about 150 Å. An example, in which a quantum well structure is formed by making the thickness of the saturable absorbing layer 206 thinner, e.g., 150 Å or less, will be described in more detailed later.

The Al mole fraction x of the saturable absorbing layer 206 is selected so that the saturable absorbing layer 206 sufficiently absorbs light irradiated by the active layer 204.

In general, the bandgap of $(Al_xGa_{1-x})_{0.5}In_{0.5}P$ increases with the increase in the Al mole fraction x. Thus, FIG. 6 can also show the profile of the bandgap in the vicinity of the active layer of the present example. As is understood from FIG. 6, the bandgap of the spacer layer 205 is larger than those of the active layer 204 and the saturable absorbing layer 206. This prevents minority carriers overflowing the active layer 204 from entering the saturable absorbing layer 206.

The bandgap of the spacer layer 205 is not required to be equal to that of the first p-type cladding layer 207 and the like. In order to enhance the barrier effect against carriers overflowing the active layer 204, the bandgap of the spacer layer 205 can be set to be larger than that of the first p-type cladding layer 207 and the like (the Al mole fraction of the spacer layer 205 can be set to be larger than 0.7). Furthermore, in order to regulate the light confinement factor of the active layer 204 and/or the saturable absorbing layer 206, the band gap of the spacer layer 205 can be set so as to be smaller than that of the other portions of the cladding structure (the Al mole fraction of the spacer layer 205 can be set to be smaller than 0.7).

In the present example, the light confinement factor of the saturable absorbing layer 206 is about 4.5%. It was found that stable self-sustained pulsation characteristics cannot be obtained in the case where the light confinement factor of the saturable absorbing layer 206 is 3%.

Figure 2:
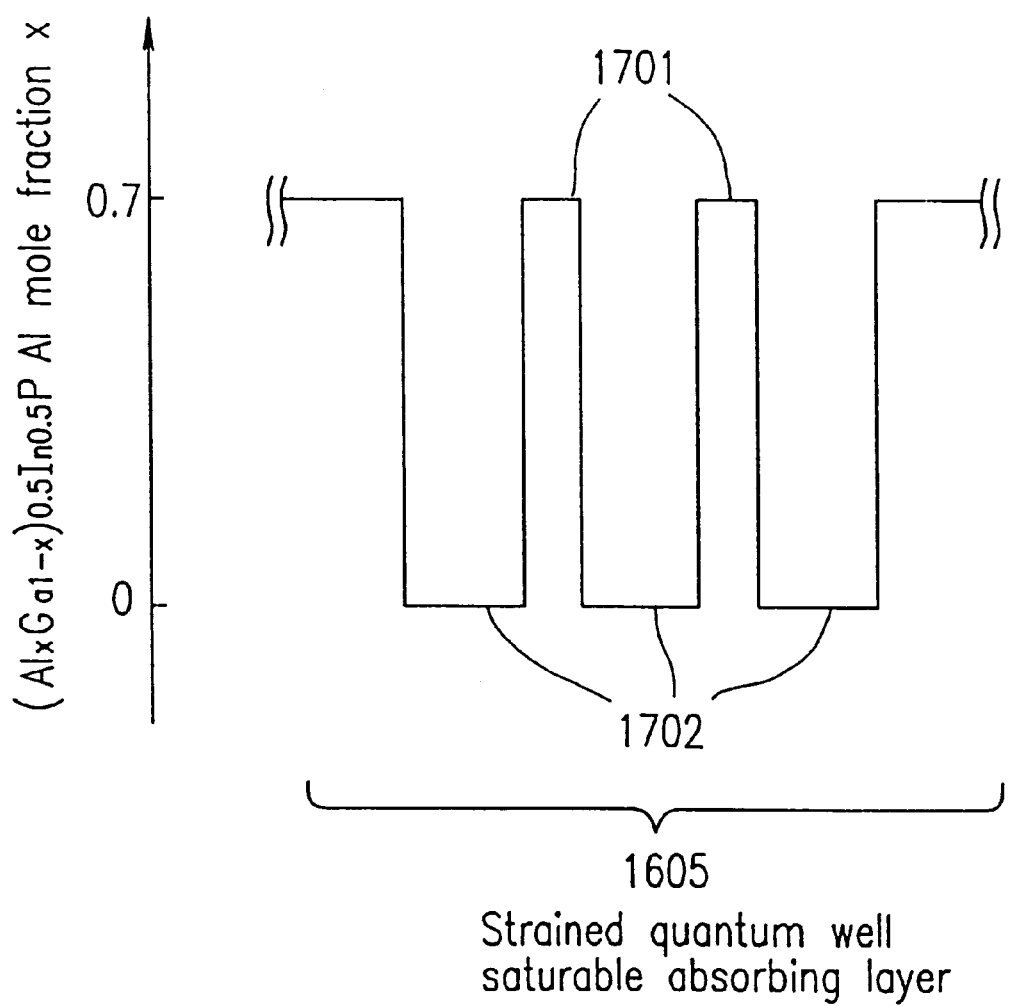
FIG. 2 is a diagram showing an Al mole fraction of a saturable absorbing layer in the conventional example.
Figure 3:
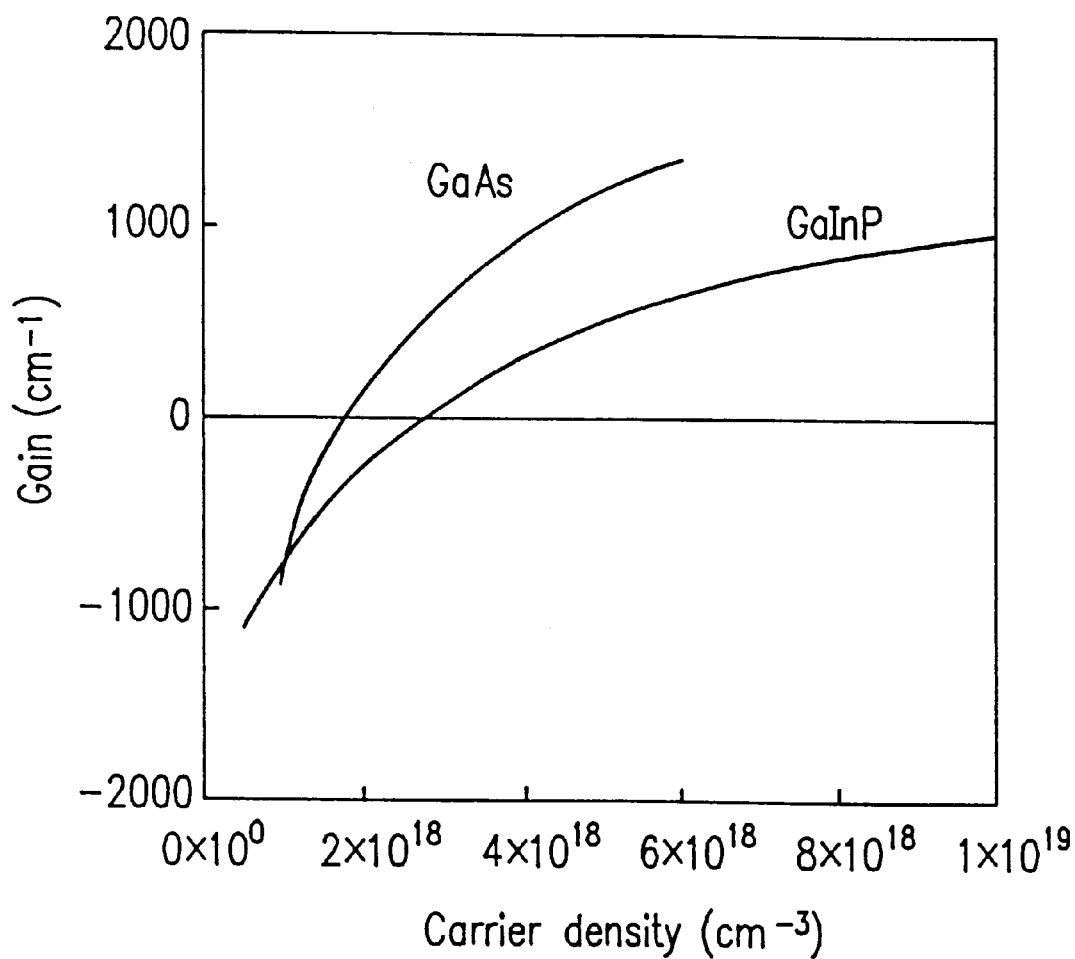
FIG. 3 is a graph showing the dependency of a gain on a carrier density (gain characteristics) with respect to GaAs and GaInP.
Figure 7:
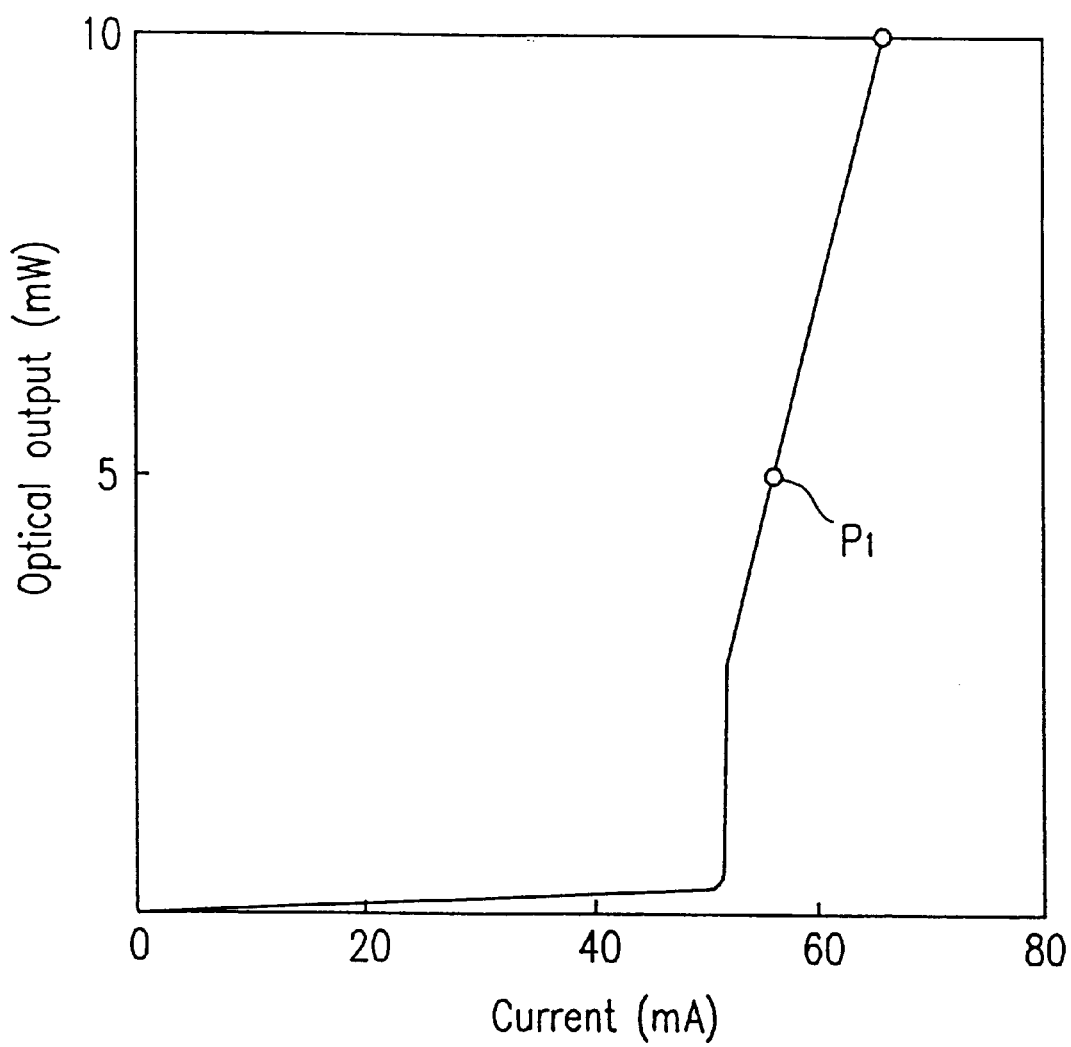
FIG. 7 is a graph showing current-light output characteristics in the first example according to the present invention.

FIG. 7 shows current-light output characteristics of the semiconductor laser device shown in FIG. 2. The threshold current is about 50 mA. In the characteristics of the self-sustained pulsation type semiconductor laser devices, an abrupt rise of a light output is found in the vicinity of the threshold current, unlike ordinary semiconductor laser devices. This is because light is not released outside until the carrier injected amount exceeds a certain threshold due to the presence of the saturable absorbing layer. When the carrier injected amount exceeds the threshold, laser oscillation is realized, and a light output starts increasing in proportion to the injected current.

Figure 8:
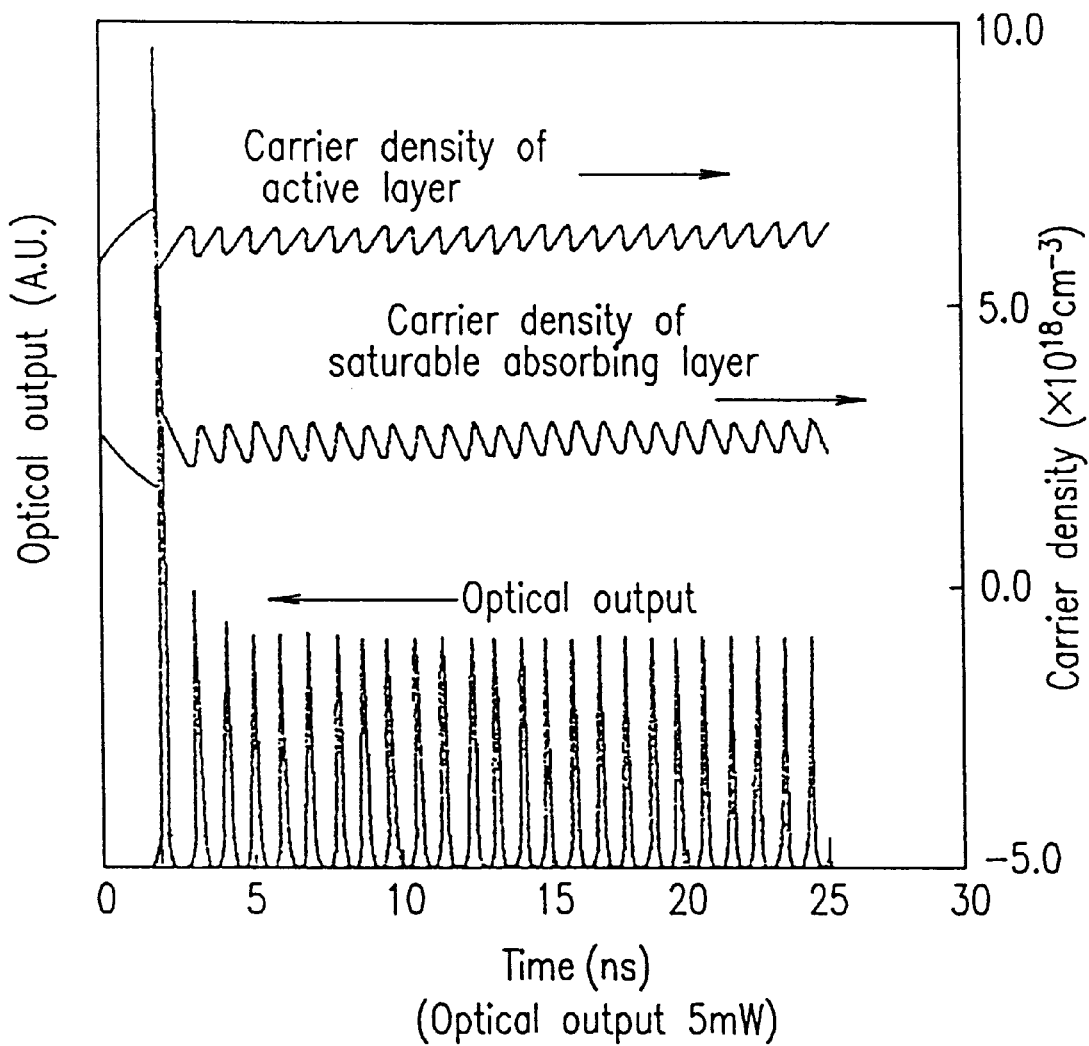
FIG. 8 is a graph showing the changes in light output and carrier density with time in the first example according to the present invention.

FIG. 8 shows the dependency of a light output on time in the case where a current corresponding to a point P1 in the graph of FIG. 7 is passed through the semiconductor laser device. The vibration waveform shown in FIG. 5 is obtained by simulation. It is understood from FIG. 8 that a vibration (self-sustained pulsation) phenomenon of a light output is realized continuously.

Figure 9:
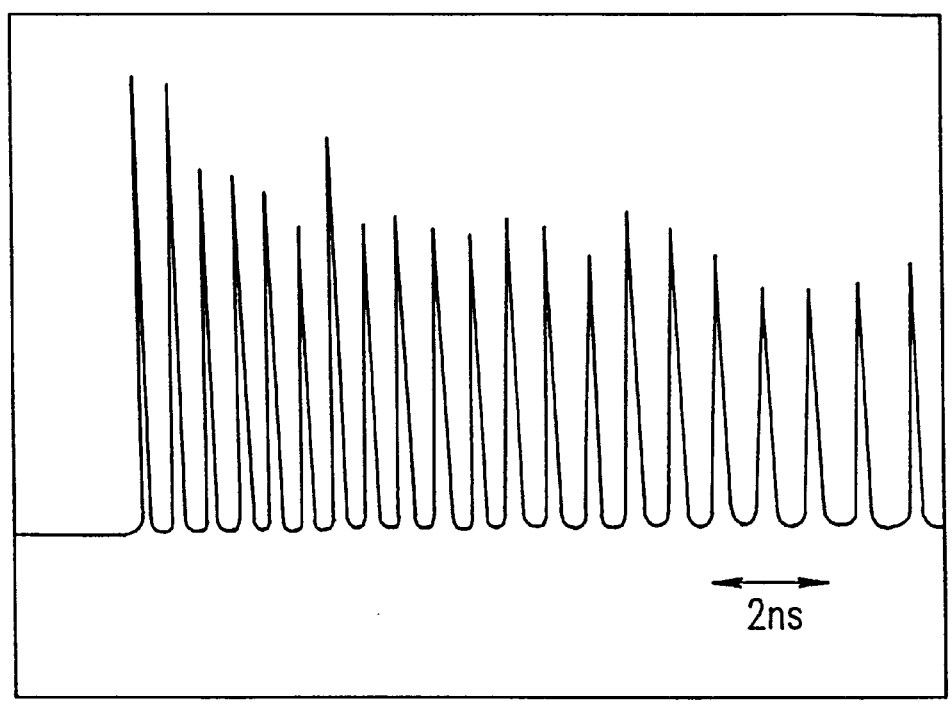
FIG. 9 is a waveform diagram showing actually measured time of the light output and the carrier density in the first example according to the present invention.

FIG. 9 shows the vibration waveform of a light output obtained by operating an actually produced self-sustained pulsation type semiconductor laser device. It was confirmed that the light output largely vibrated with time and self-sustained pulsation was realized.

Referring to FIG. 7, when the injected current further increases after reaching the value corresponding to the point P1 of FIG. 7, self-sustained pulsation stops and ordinary laser oscillation is realized. The light output at which the self-sustained pulsation stops is assumed to be called the maximum self-sustained pulsation output ($P_{max}$).

Figure 10:
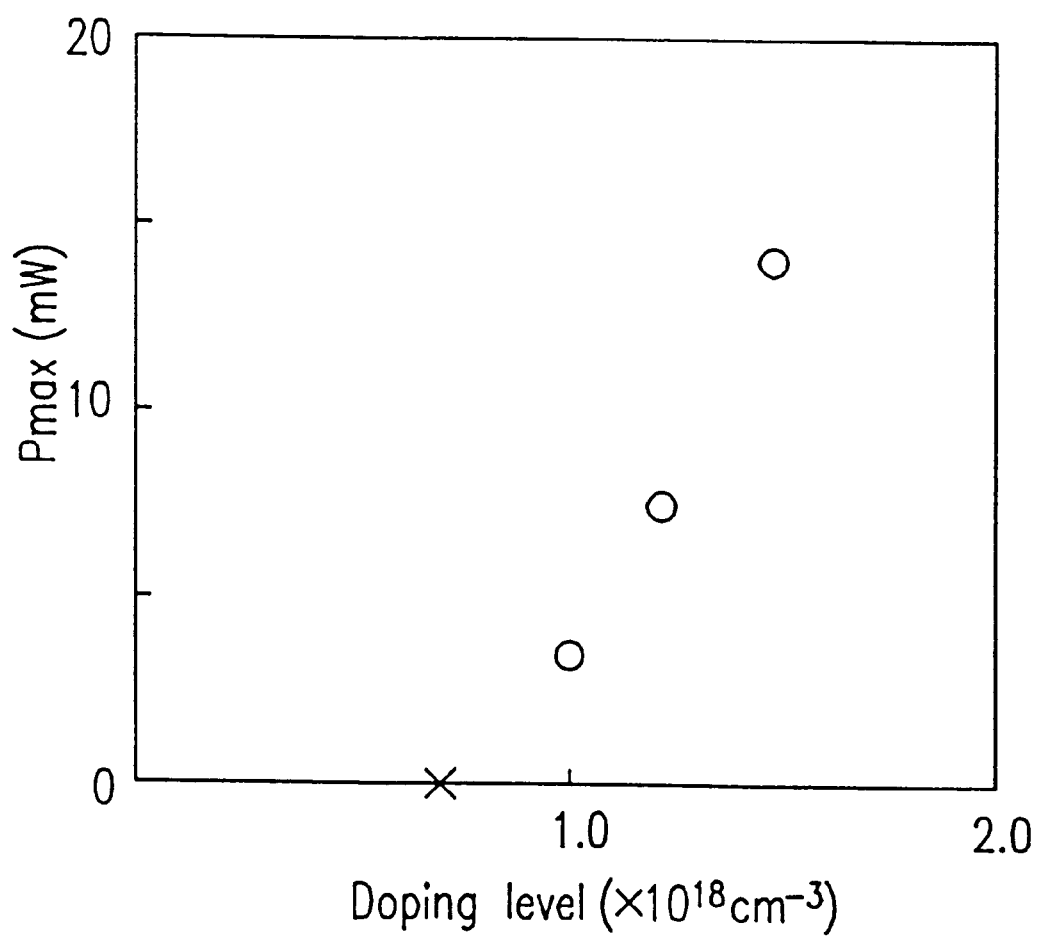
FIG. 10 is a graph showing the dependency of the maximum self-sustained pulsation output ($P_{max}$) on a doping level of a saturable absorbing layer.

FIG. 10 shows the dependency of the maximum self-sustained pulsation output ($P_{max}$) on the doping level of the saturable absorbing layer. As is apparent from FIG. 10, in the case where the doping level of the saturable absorbing layer is lower than $1 \times 10^{18}$ cm$^{-3}$ (e.g., $0.8 \times 10^{18}$ cm$^{-3}$), self-sustained pulsation is not realized. In contrast, when the doping level of the saturable absorbing layer is $1 \times 10^{18}$ cm$^{-3}$, the maximum self-sustained pulsation output ($P_{max}$) is 5.1 mW; when the doping level of the saturable absorbing layer is $1.5 \times 10^{18}$ cm$^{-3}$, the maximum self-sustained pulsation output ($P_{max}$) is 8.2 mW; and when the doping level of the saturable absorbing layer is $2.0 \times 10^{18}$ cm$^{-3}$, the maximum self-sustained pulsation output ($P_{max}$) is 14.3 mW. Thus, when the doping level is $1 \times 10^{18}$ cm$^{-3}$ or more, the maximum self-sustained pulsation output ($P_{max}$) rapidly increases.

Next, the function of the spacer layer will be described with reference to FIG. 6.

The result of a study of the spacer layer 205 provided between the active layer 204 and the saturable absorbing layer 206 will be described. The saturable absorbing layer 206 comes closer to the active layer 204 as the spacer layer 205 becomes thinner. Therefore, the light confinement factor of the saturable absorbing layer 206 increases. However, when the spacer layer 205 is made much thinner, minority carriers (electrons) are injected from the active layer 204 to the saturable absorbing layer 206.

Figure 11A:
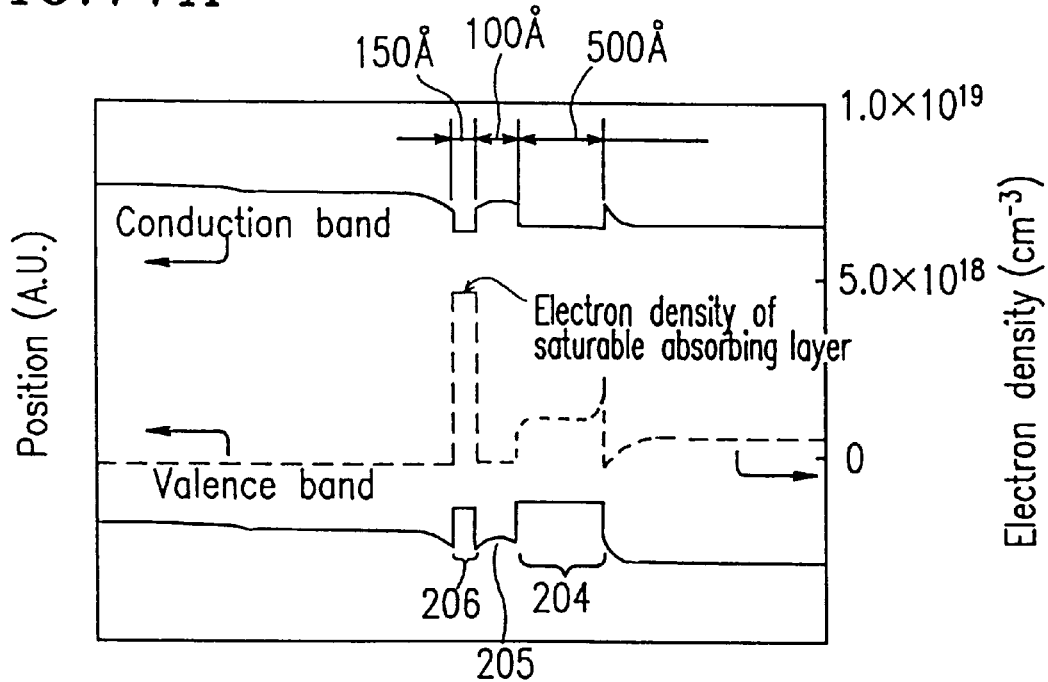
FIGS. 11A and 11B are diagrams showing an energy band and electron density distribution in the first example according to the present invention.
Figure 11B:
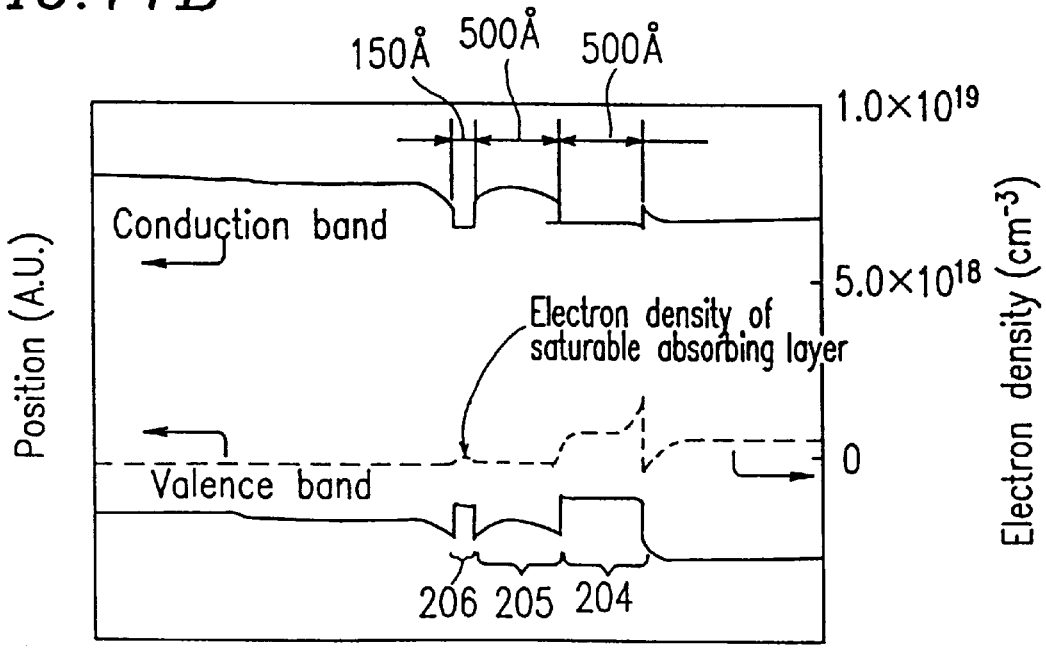

FIGS. 11A and 11B are diagrams respectively showing an energy band (solid line) and a profile of an electron density (dotted line) in the case where an applied voltage of the semiconductor laser device is 1.9 volts. FIG. 11A shows the case where the thickness of the spacer layer 205 is 100 Å, and FIG. 11B shows the case where the thickness of the spacer layer 205 is 500 Å.

In the case where the spacer layer 205 is 500 Å, the electron density of the saturable absorbing layer 206 slightly increases, compared with the electron density of the other portions of the cladding structure. However, in the case where the spacer layer 205 is 100 Å, the electron density of the saturable absorbing layer 206 exceeds that of the active layer 204. This means that a significant amount of electrons are injected into the saturable absorbing layer 206.

When having an extremely high electron density due to the injection of carriers, the saturable absorbing layer has a gain and does not absorb laser light any more. Therefore, it becomes impossible for self-sustained pulsation to be realized. It was found from an experiment that the thickness of the spacer layer 205 is required to be larger than 100 Å.

Figures 12, 13:
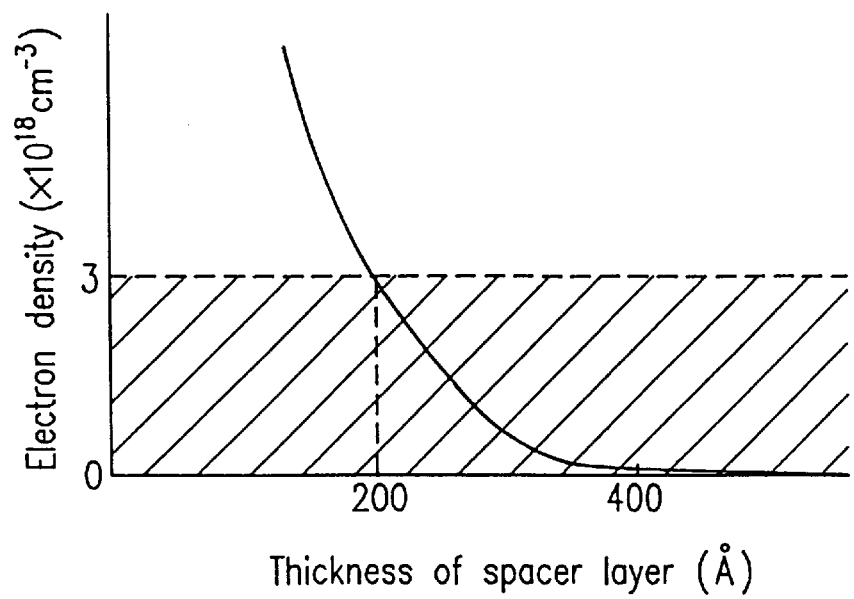
FIG. 12 is a graph showing electron density in the saturable absorbing layer with respect to the thickness of a spacer layer in the first example according to the present invention.
FIG. 13 is a diagram showing the presence of self-sustained pulsation of light output with respect to the thickness of the spacer layer in the first example according to the present invention.

FIG. 12 is a graph showing the relationship between the thickness of the spacer layer and the electron density of the saturable absorbing layer. It is understood from this graph that when the spacer layer becomes thicker, the electron density of the saturable absorbing layer can be reduced. In order to realize self-sustained pulsation, it is required to suppress the electron density to be $3 \times 10^{18}$ cm$^{-3}$ or less. As is understood from FIG. 12, in order to prescribe the electron density to be $3 \times 10^{18}$ cm$^{-3}$ or less, the thickness of the spacer layer is required to be 200 Å or more. FIG. 13 shows the result of an experiment regarding the thickness of the spacer layer and the presence of a self-sustained pulsation phenomenon. It is understood from FIGS. 12 and 13 that in order to realize stable self-sustained pulsation, the thickness of the spacer layer is required to be about 200 Å or more.

Figure 14A:
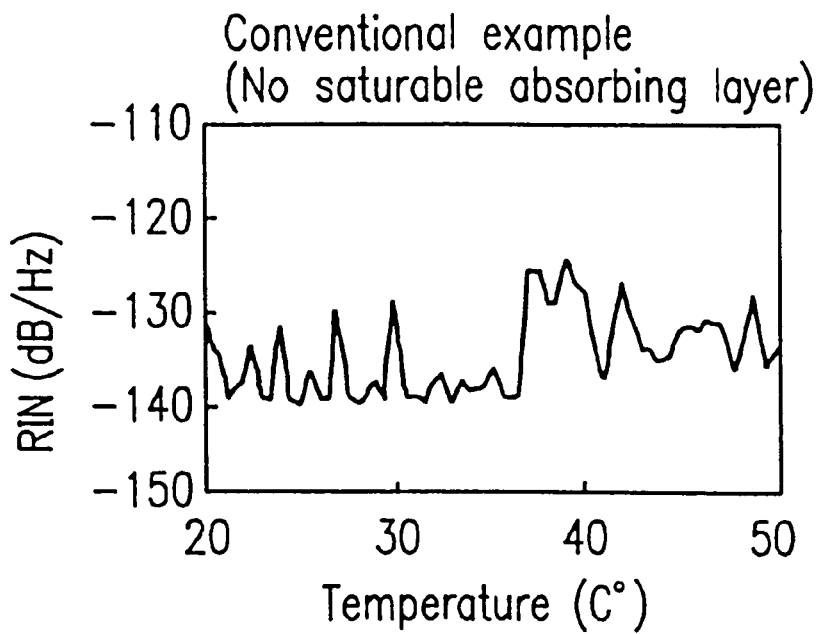
FIGS. 14A and 14B show the comparison in noise characteristics between the first example according to the present invention and the conventional example.
Figure 14B:
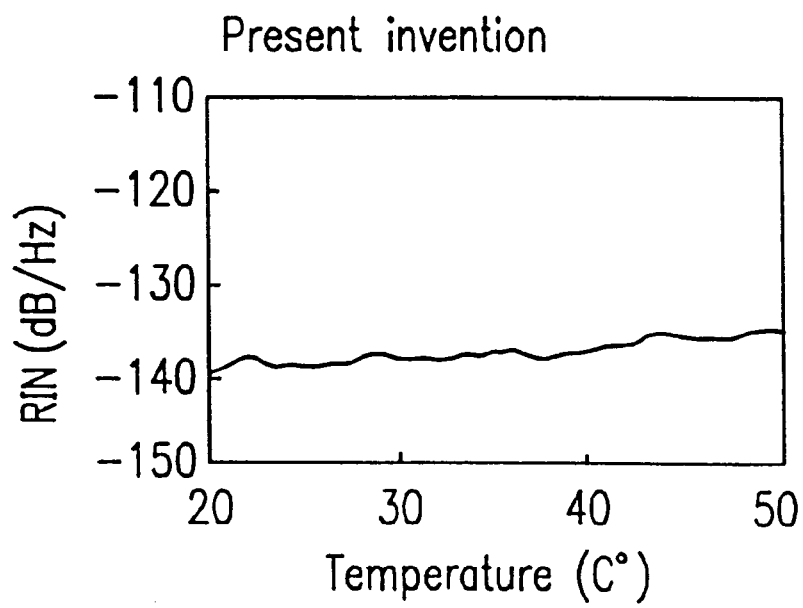

FIGS. 14A and 14B show relative intensity noise (RIN) characteristics of semiconductor laser devices. FIG. 14A shows the characteristics of a semiconductor laser device having no saturable absorbing layer, and FIG. 14B shows the characteristics of the semiconductor laser device of the present invention.

The semiconductor laser device of the present invention shows stable low noise characteristics in a wide temperature range. In particular, a value of −140 dB is obtained, so that it is understood that the semiconductor laser of the present invention is practically suitable.

Next, the impurity concentration of the spacer layer will be described.

Figure 15A:
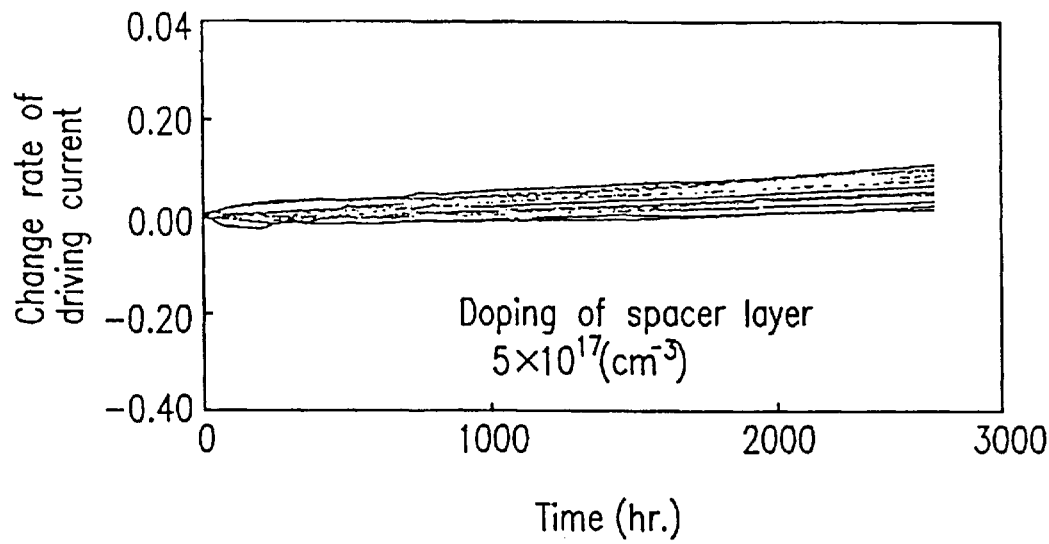
FIGS. 15A and 15B show the results of reliability tests in the case where the spacer layer is doped in a concentration of $5 \times 10^{17}$ cm$^{-3}$ and $2 \times 10^{18}$ cm$^{-3}$ in the first example according to the present invention.
Figure 15B:
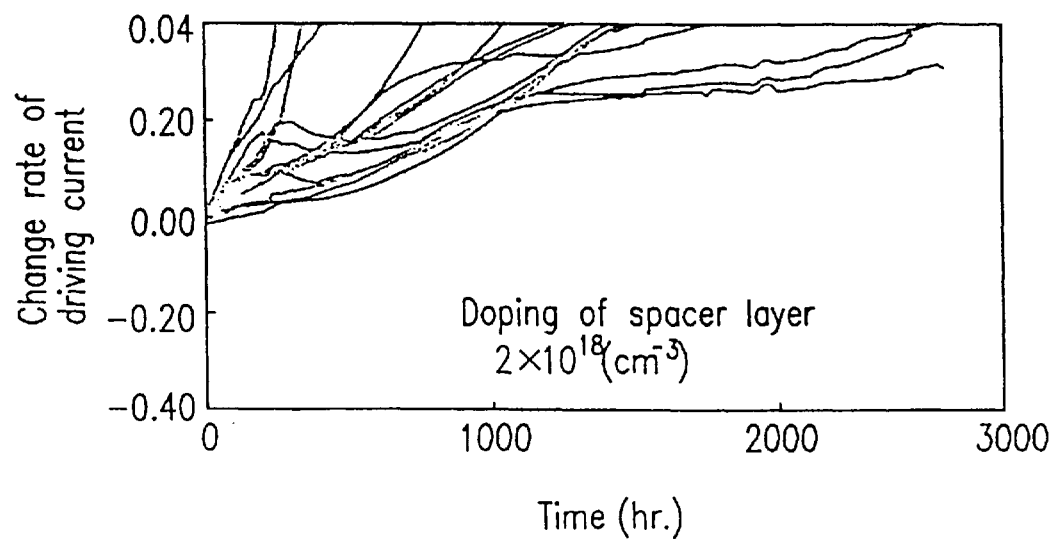

When the carrier lifetime in the saturable absorbing layer is shortened by uniformly doping the spacer layer and the saturable absorbing layer with impurities, the impurities diffuse into the active layer to degrade laser device characteristics, resulting in decreased reliability of the device. FIG. 15A shows the result of a reliability test in the case where the doping level of the spacer layer is $5 \times 10^{17}$ cm$^{-3}$, and FIG. 15B shows the result of a reliability test in the case where the doping level of the spacer layer is $2 \times 10^{18}$ cm$^{-3}$. As is understood from FIGS. 15A and 15B, when the spacer layer is doped with a dopant in a concentration of $2 \times 10^{18}$ cm$^{-3}$, the dopant diffuses up to the active layer. Then, the working current of the laser device rapidly changes with time, making the device impractical. It was found that in the case of such a high doping level, the laser device was remarkably degraded.

As described above, when a region in the vicinity of the active layer is doped with an impurity in a high concentration, the laser device characteristics degrade. Thus, the following is required in order to obtain a highly reliable semiconductor laser device capable of realizing stable self-sustained pulsation: A region in the vicinity of the active layer is doped with an impurity in a relatively low concentration as in a conventional example, while the saturable absorbing layer is doped with an impurity in a high concentration as in the present invention.

Hereinafter, the saturable absorbing layer and the profile of the impurity concentration in the vicinity thereof will be described in more detail.

Figure 16:
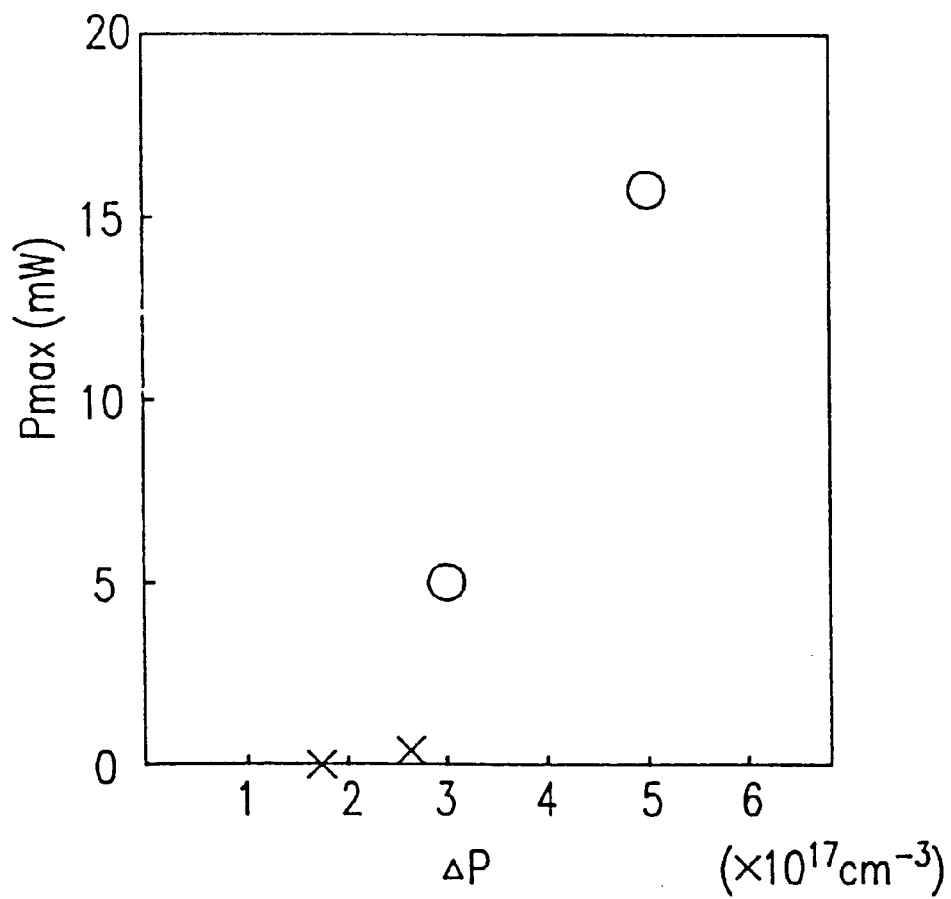
FIG. 16 is a graph showing the dependency of the maximum self-sustained pulsation output ($P_{max}$) on the difference ($\Delta P$) between the doping level of the spacer layer and that of the saturable absorbing layer.

Herein, it is assumed that the difference between the doping level of the spacer layer and that of the saturable absorbing layer is ΔP. FIG. 16 shows the dependency of $P_{max}$ on ΔP. As is apparent from this figure, ΔP is preferably $0.3 \times 10^{18}$ cm$^{-3}$ or more. The spacer layer is not required to be uniformly doped with an impurity, and the spacer layer can be formed so as to include a portion doped with an impurity in a relatively high concentration and a portion doped with an impurity in a low concentration.

FIGS. 17 to 20 show impurity concentration profiles of the saturable absorbing layer and the vicinity thereof.

Figure 17:
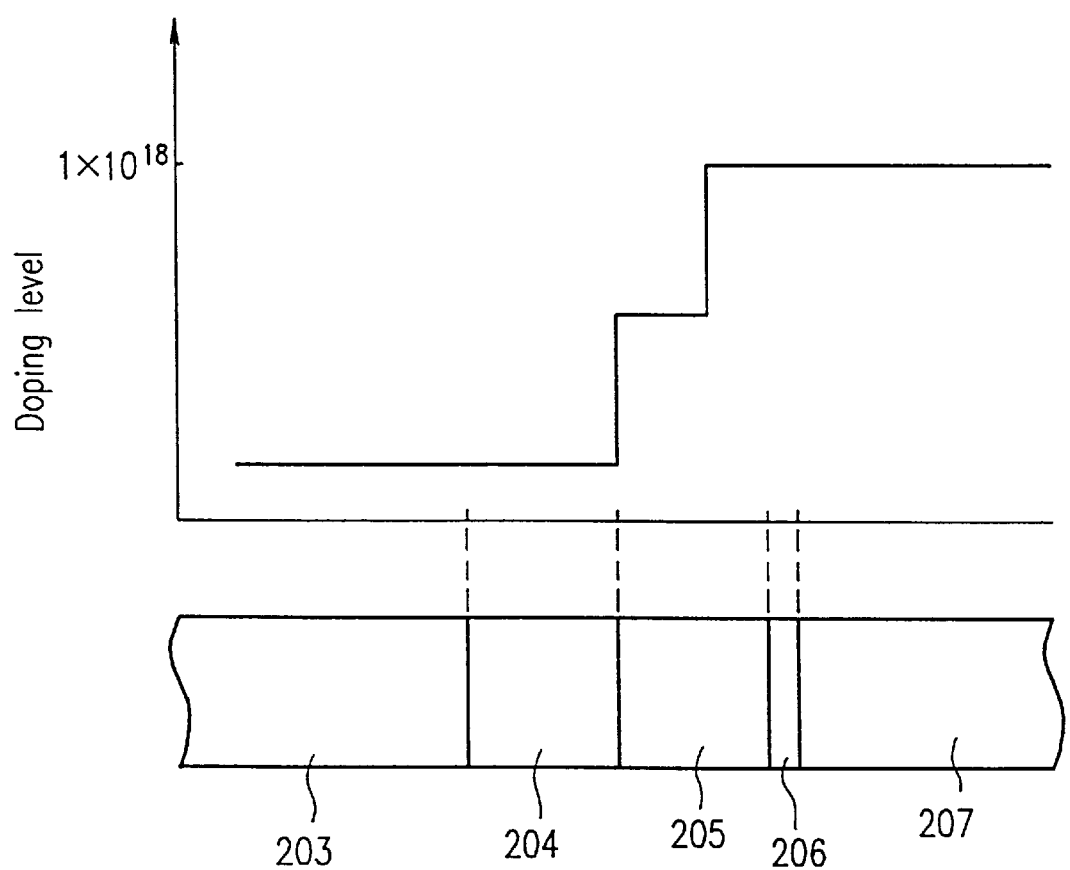
FIGS. 17 through 20 are graphs showing impurity concentration profiles in the saturable absorbing layer and in the vicinity thereof.

Referring to FIG. 17, the doping levels of a part of the spacer layer 205 and the saturable absorbing layer 206 are $1.0 \times 10^{18}$ cm$^{-3}$, while a portion of the spacer layer 205 adjacent to the active layer 204 is lower than $1.0 \times 10^{18}$ cm$^{-3}$. In this example, the difference between the doping level of the portion of the spacer layer 205 adjacent to the active layer 204 and that of the saturable absorbing layer 206 is $0.3 \times 10^{18}$ cm$^{-3}$ or more, so that stable self-sustained pulsation can be realized.

Figure 18:
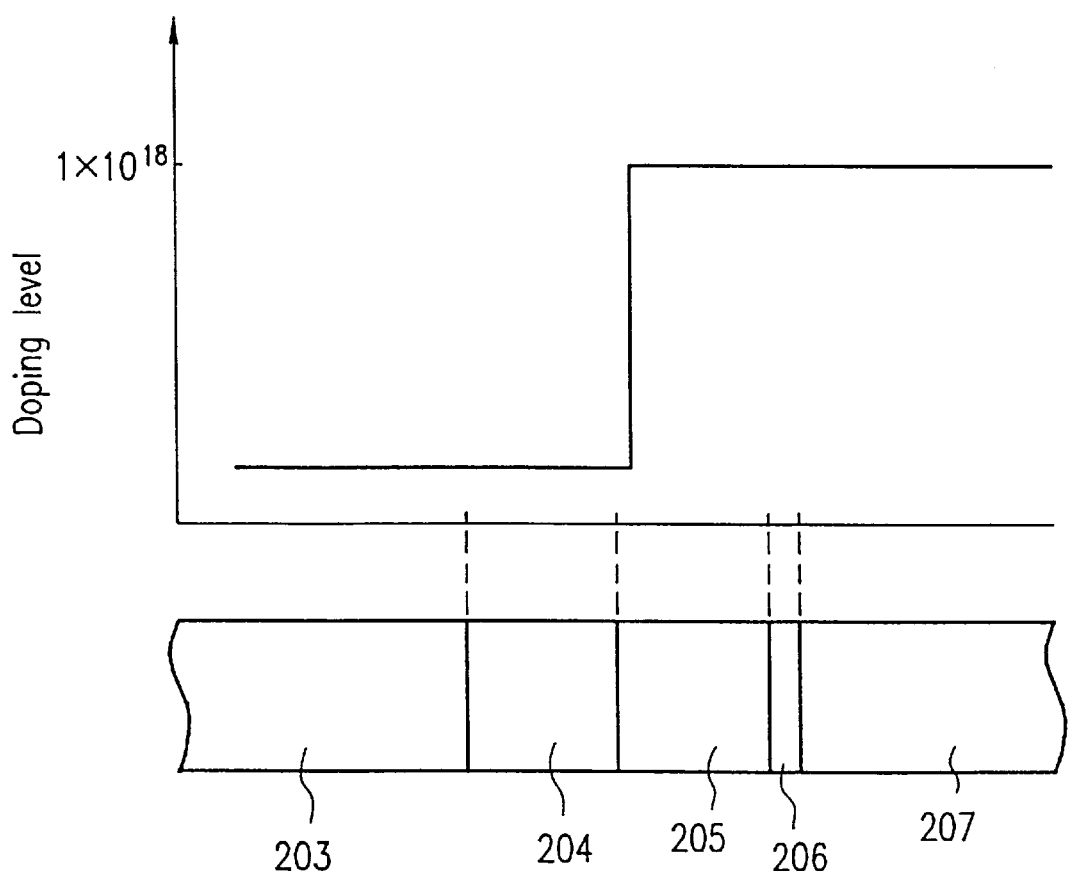

Referring to FIG. 18, the spacer layer 205 is mostly doped with an impurity at almost the same doping level as that of the saturable absorbing layer 206, while a portion of the spacer layer 205 in the vicinity of the active layer 204 is doped with an impurity at almost the same doping level as that of the active layer 204. In this example, the difference between the doping level of the portion of the spacer layer 205 in the vicinity of the active layer 204 and that of the saturable absorbing layer 206 is also $0.3 \times 10^{18}$ cm$^{-3}$ or more, so that stable self-sustained pulsation can be realized.

Figure 19:
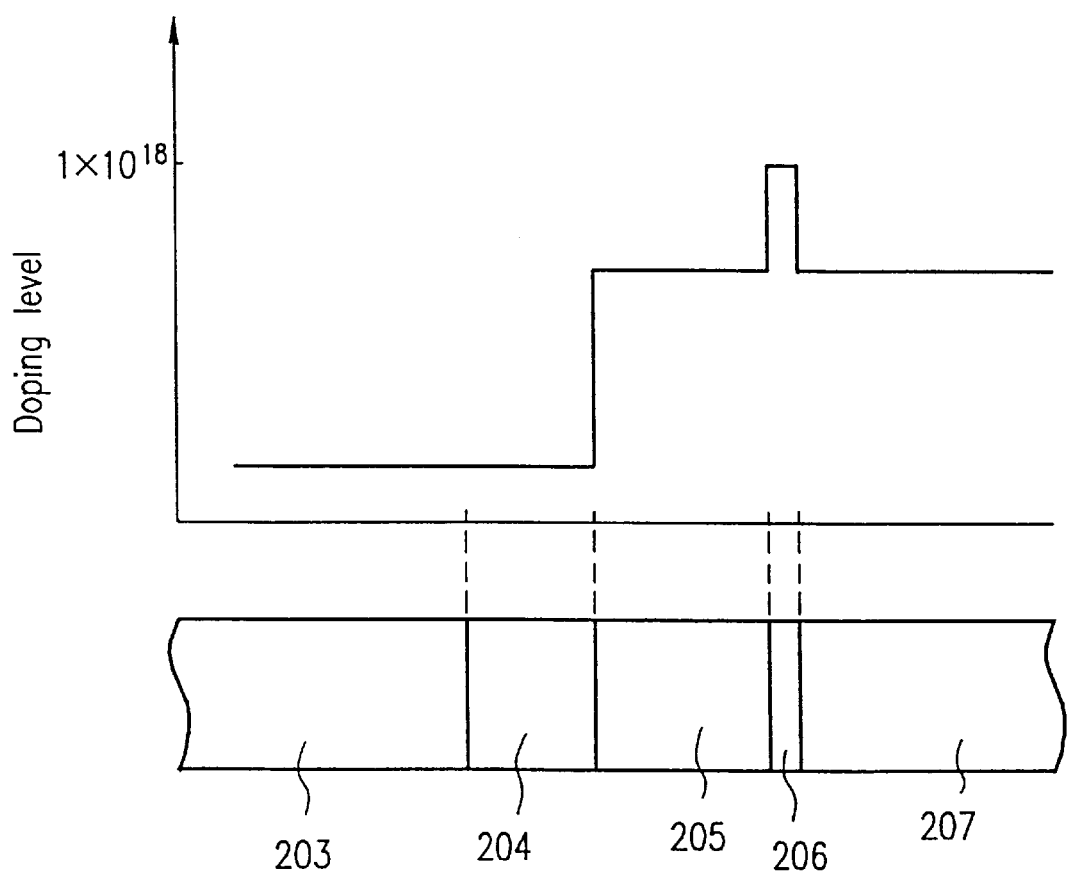

Referring to FIG. 19, the spacer layer 205 is uniformly doped with an impurity. In this case, the difference between the doping level of the spacer layer 205 and that of the saturable absorbing layer 206 is also $0.3 \times 10^{18}$ cm$^{-3}$ or more, so that stable self-sustained pulsation can be realized.

Figure 20:
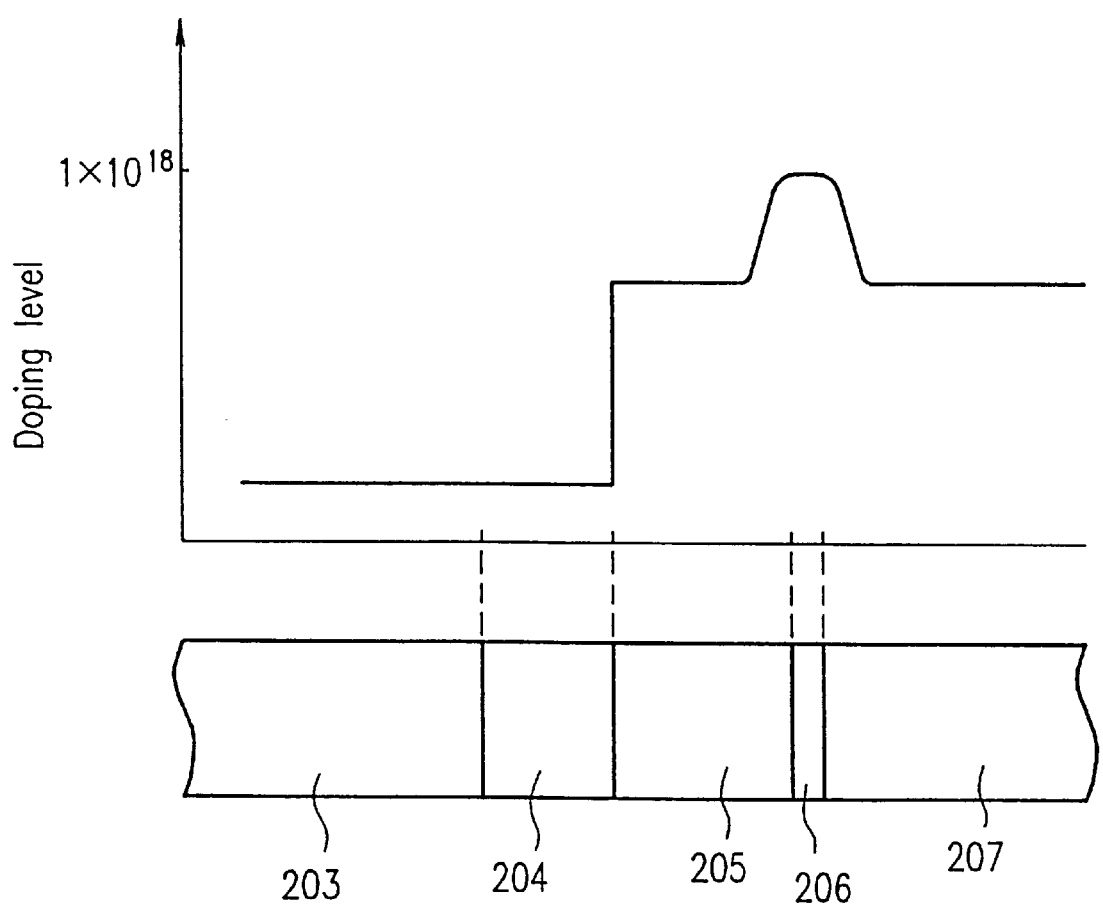

In the case where the saturable absorbing layer 206 is doped with an impurity in a high concentration, a part of the impurity may diffuse from the saturable absorbing layer 206 to a layer adjacent thereto, as shown in FIG. 20.

In the present example, as shown in FIG. 6, although the saturable absorbing layer 206 is provided in the first p-type cladding layer 207, it can be provided in the n-type cladding layer 203. As described in the present example, when the saturable absorbing layer 206 is positioned extremely close to the active layer 204 or when the doping level of the spacer layer 205 between the active layer 204 and the saturable absorbing layer 206 is prescribed to be too high, the device will lose its reliability in practicable application. When the saturable absorbing layer 206 is provided at an appropriate position in the n-type cladding layer 203, the carrier lifetime in the saturable absorbing layer 206 can be shortened to realize stable self-sustained pulsation in the same manner as in the case where the saturable absorbing layer 206 is provided in the p-type cladding layer 207.

EXAMPLE 2

The second example of the semiconductor laser device according to the present invention will be described. This semiconductor laser device has an active layer including a quantum well structure, so that a light output higher than that of the first example can be obtained.

Figure 21:
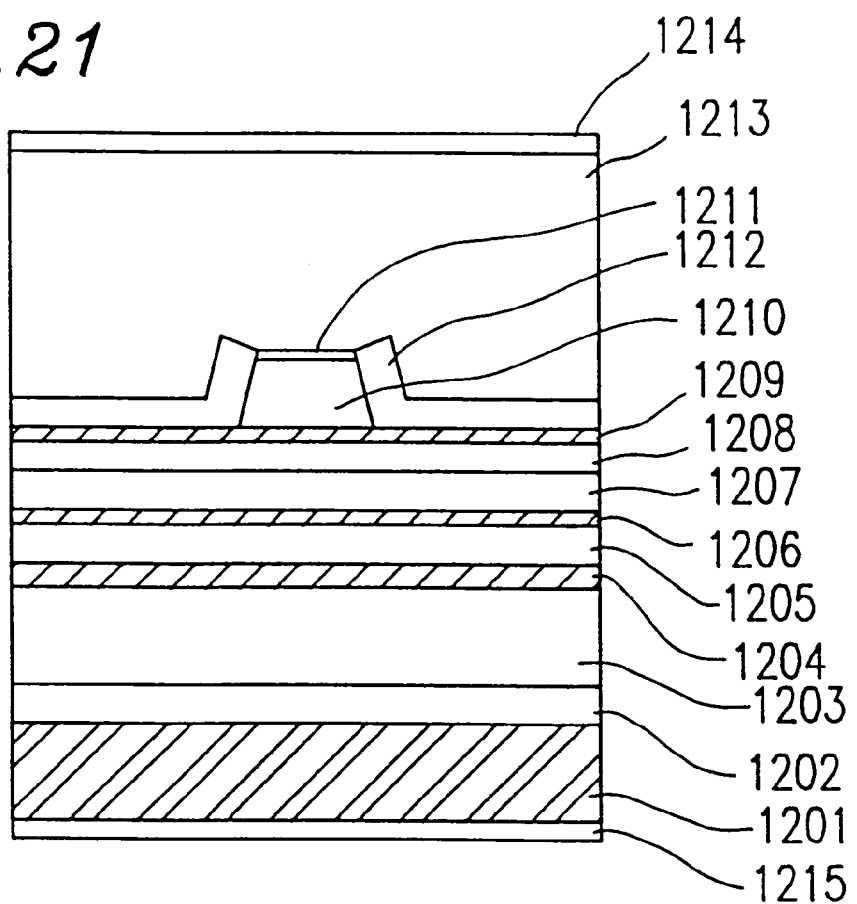
FIG. 21 is a cross-sectional view of an AlGaInP type semiconductor laser device in the second example according to the present invention.

As shown in FIG. 21, the semiconductor laser device includes an n-type GaAs substrate 1201 and a semiconductor layer structure formed on the GaAs substrate 1201. The semiconductor layer structure includes an n-type GaAs buffer layer 1202, an n-type AlGaInP cladding layer 1203, a multi-quantum well active layer 1204 made of AlGaInP and GaInP, a p-type AlGaInP spacer layer 1205, a p-type GaInP highly doped quantum well saturable absorbing layer 1206, an optical guide layer 1207, a first p-type AlGaInP cladding layer 1208, a p-type GaInP etching stopping layer 1209, and a second p-type AlGaInP cladding layer 1210.

The second p-type AlGaInP cladding layer 1210 has a stripe shape (width: about 2.0 to 7.0 µm) extending in a cavity length direction.

A contact layer 1211 is formed on the upper surface of the second p-type cladding layer 1210. An n-type GaAS current blocking layer 1212 is formed on both sides of the second p-type cladding layer 1210 and the contact layer 1211. A p-type GaAs cap layer 1213 is formed on the contact layer 1211 and the current blocking layer 1212. A p-type electrode 1214 is formed on the upper surface of the cap layer 1213, and an n-type electrode 1215 is formed on the reverse surface of the substrate 1201. The active layer 1204 has a multi-quantum well structure made of 3 well layers and 3 barrier layers.

The kind, thickness, impurity concentration, and the like of each semiconductor layer forming this semiconductor laser device are the same as those in the first example. The characteristics of the semiconductor laser device of the present example are as follows:

1) The quantum well saturable absorbing layer 1206 (thickness: 30 Å to 150 Å) is used as a saturable absorbing layer.

2) The multi-quantum well active layer 1204 is used as an active layer.

3) The saturable absorbing layer 1206 is doped in a high concentration ($1.0 \times 10^{18}$ cm$^{-3}$ or more).

4) The optical guide layer 1207 (thickness: 300 Å to 1500 Å) made of $(Al_{0.5}Ga_{0.5})_{0.5}In_{0.5}P$ is provided adjacent to the saturable absorbing layer 1206.

Hereinafter, the semiconductor laser device of the present example will be described in more detail with reference to FIG. 22.

Figure 22:
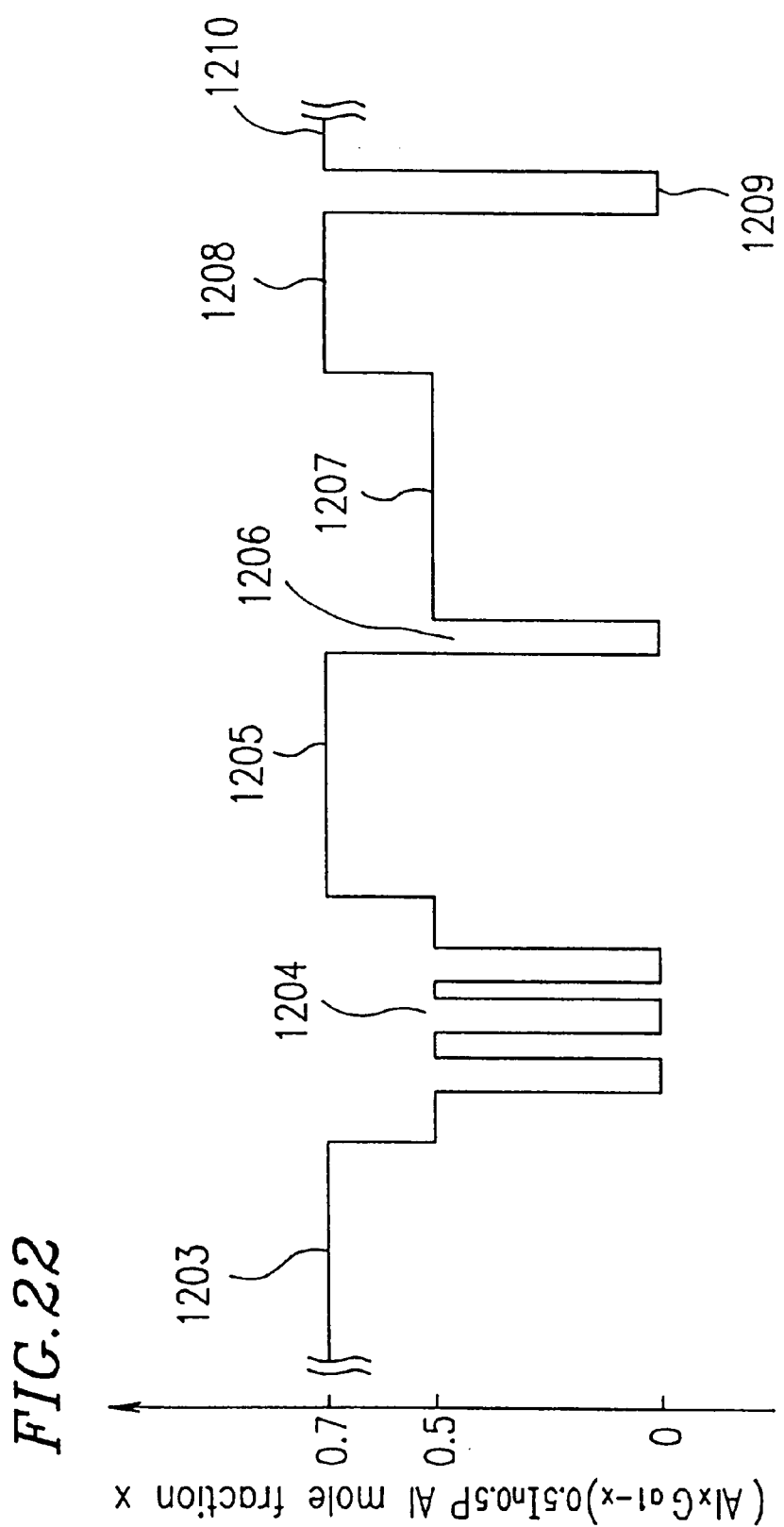
FIG. 22 is a diagram showing an Al mole fraction in the vicinity of an active layer in the second example according to the present invention.

As is apparent from FIG. 22, in the present example, the optical guide layer 1207 is provided in the vicinity of the saturable absorbing layer 1206. The optical guide layer 1207 has a refractive index smaller than that of the saturable absorbing layer 1206 and larger than those of the spacer layer 1205 and the first p-type cladding layer 1208.

In the case where the saturable absorbing layer 1206 is made thin so as to have a quantum well structure, the light confinement factor thereof decreases greatly. In addition, the saturable absorbing layer 1206 doped in a high concentration cannot be provided so close to the active layer 1204. Consequently, self-sustained pulsation cannot be realized in this state.

In the present example, the light confinement factor of the saturable absorbing layer 1206 is increased by arranging the optical guide layer 1207 made of $(Al_{0.5}Ga_{0.5})_{0.5}In_{0.5}P$ with a refractive index larger than those of the other portions of the cladding structure in the vicinity of the saturable absorbing layer 1206. When the optical guide layer 1207 is inserted so as to set the light confinement factor of the saturable absorbing layer 1206 to be at least about 1.5% or more, stable self-sustained pulsation can be realized.

In the case of rendering the saturable absorbing layer 1206 a quantum well, the light confinement factor thereof cannot be set large enough to realize self-sustained pulsation without the optical guide layer 1207 because of small thickness of the saturable absorbing layer 1206. When the number of layers of the saturable absorbing layer 1206 is increased so as to increase the light confinement factor thereof, the volume of the saturable absorbing layer 1206 increases to decrease the carrier density thereof; as a result, self-sustained pulsation is not realized. Thus, self-sustained pulsation was realized by providing the optical guide layer 1207 in the vicinity of the saturable absorbing layer 1206.

The bandgap of the optical guide layer 1207 is preferably larger than that of the saturable absorbing layer 1206 and smaller than that of the spacer layer 1205. However, when the bandgap of the optical guide layer 1207 is too close to that of the saturable absorbing layer 1206, too much light is confined in the saturable absorbing layer 1206. As a result, saturation characteristics of light absorption are not shown.

The multi-quantum well active layer 1204 includes 3 quantum well layers, and the thickness of each quantum well layer is 50 Å. The optical guide layer 1207 in the vicinity of the quantum well saturable absorbing layer 1206 is made of a layer with a thickness of 1500 Å (mole fraction x=0.5). It is found that the thickness of the optical guide layer 1207 becomes effective when it is 200 Å or more.

The quantum well saturable absorbing layer 1206 can be provided closer to the multi-quantum well active layer 1204 as long as minority carriers are not injected into the quantum well saturable absorbing layer 1206. When the quantum well saturable absorbing layer 1206 is positioned too close to the active layer 1204, minority carriers having overflown the active layer 1204 are injected into the saturable absorbing layer 1206. Thus, it is appropriate that the saturable absorbing layer 1206 is provided in the vicinity of the active layer 1204 so as to prevent minority carriers from being injected into the saturable absorbing layer 1206 as much as possible. In order to suppress the injection of minority carriers from the active layer 1204 to the saturable absorbing layer 1206, the bandgap of the spacer layer 1205 is preferably prescribed to be larger than those of the other portions of the cladding structure. Preferable thickness and impurity concentration of the spacer layer 1205 described in Example 1 can also be applied to the present example.

The maximum light output ($P_{max}$) of the semiconductor laser device of the present example increased by about 20%, compared with the maximum light output of the semiconductor laser device using a bulk active layer, by introducing a quantum well structure into the multi-quantum well active layer 1204. In addition, the threshold current decreased, enabling the semiconductor laser device to operate at high temperatures.

In the semiconductor laser device of the present example, the self-sustained pulsation phenomenon as shown in FIG. 9 was confirmed and the relative intensity noise (RIN) of −130 dB/Hz or less was obtained.

As described above, the characteristics of the semiconductor laser device of the present example can be realized by adopting a novel structure including a quantum well active layer, a low concentration spacer layer, a highly doped saturable absorbing layer, and an optical guide layer.

EXAMPLE 3

The third example of the semiconductor laser device of the present invention will be described with reference to FIG. 23.

A buffer layer 1402, an n-type cladding layer 1403 made of AlGaInP, an active layer 1404, a first p-type cladding layer 1405 made of AlGaInP, and an etching stopping layer 1406 made of p-type GaInP are formed in this order on an n-type GaAs substrate 1401. A ridge-shaped second p-type cladding layer 1407 made of AlGaInP and a contact layer 1408 made of p-type GaInP are formed on the etching stopping layer 1406. Both sides of the ridge-shaped second p-type cladding layer 1407 and the contact layer 1408 are covered with a current blocking layer 1409 made of an n-type GaAs layer. Furthermore, a cap layer 1410 made of p-type GaAs is formed on the contact layer 1408 and the current blocking layer 1409. A p-type electrode 1411 and an n-type electrode 1412 are formed on the cap layer 1410 and on the reverse surface of the substrate 1401, respectively.

Furthermore, zinc (Zn) as a p-type impurity diffuses outside of the ridge stripe (i.e., a region adjacent to a current injection region). This enables a highly doped saturable absorbing region 1413 to be formed in a region outside of the current injection region of the active layer 1404.

The semiconductor laser device of the present example is different from the above-mentioned one in that a part of the active layer 1404 functions as a saturable absorbing region. A part of light generated in the current injection region of the active layer 1404 diffuses to the saturable absorbing region 1413 positioned on both sides of the current injection region and is absorbed by the saturable absorbing region 1413, whereby a self-sustained pulsation phenomenon is realized.

As the carrier lifetime of the saturable absorbing region 1413 is shorter, self-sustained pulsation is more likely to be realized. More specifically, it is required to prescribe the lifetime to be 6 nanoseconds or less, and it is desirable to prescribe the carrier concentration of the saturable absorbing region 1413 to be $1 \times 10^{18}$ cm$^{-3}$ or more.

Furthermore, it is understood from the result of an experiment that the amount of light distributed in the saturable absorbing region 1413 is required to be 1% or more of the total light amount.

Figure 23:
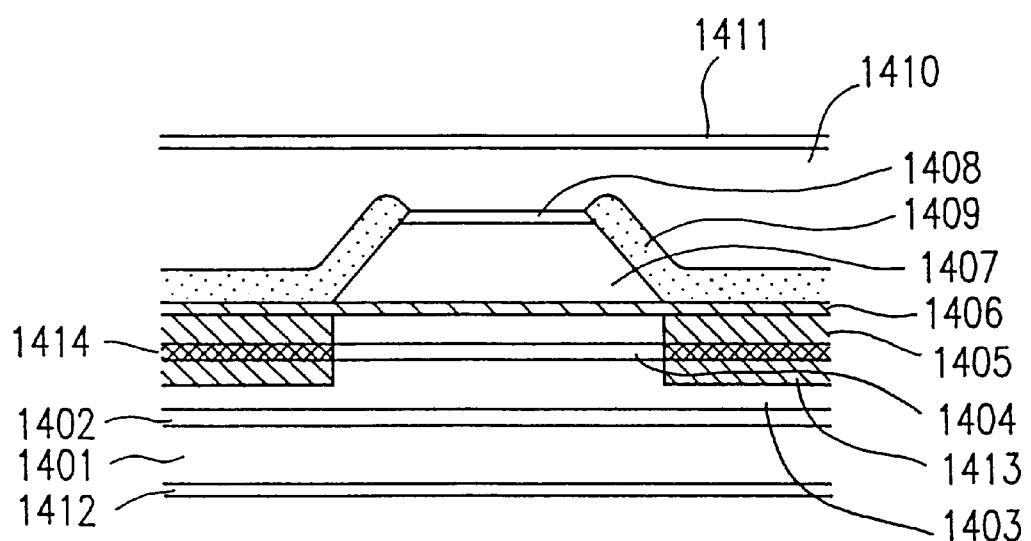
FIG. 23 is a cross-sectional view of an AlGaInP type semiconductor laser device in the third example according to the present invention.

In the semiconductor laser device as shown in FIG. 23, a self-sustained pulsation phenomenon was realized and an RIN of −130 dB/Hz or less was obtained.

In the present example, the saturable absorbing region doped with diffused Zn in a high concentration is formed. However, a region of the active layer 1404 functioning as a saturable absorbing region can be doped with an impurity in a high concentration by using another doping method such as an ion implantation method.

EXAMPLE 4

Figure 24:
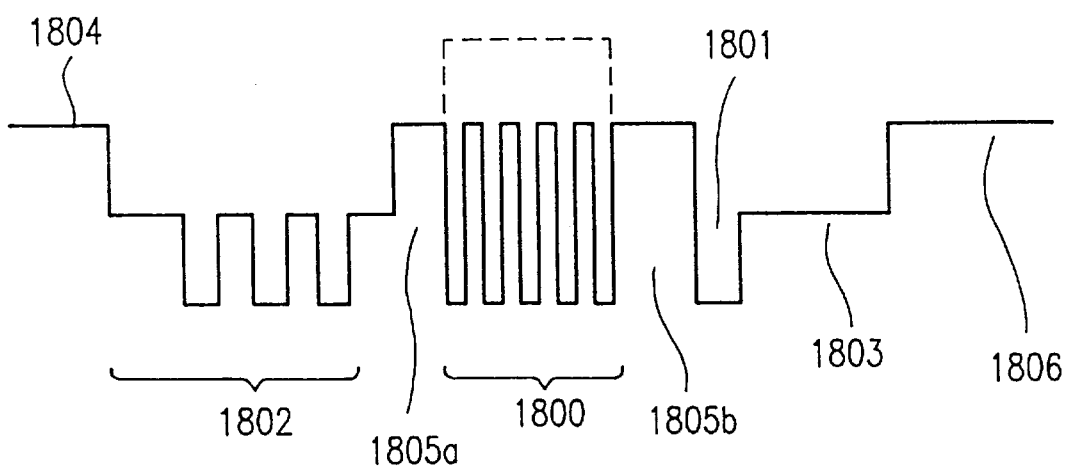
FIG. 24 is a diagram showing a fraction structure in the vicinity of an active layer in the fourth example according to the present invention.

The fourth example of the semiconductor laser device will be described with reference to FIG. 24. FIG. 24 shows an energy band of each layer including an n-type cladding layer 1804 through a first p-type cladding layer 1806. This energy band is similar to that of FIG. 12.

In the present example, a region (spacer layer) between an active layer and a saturable absorbing layer is composed of 3 portions (1800, 1805a, and 1805b). A first spacer layer 1805a is made of an $(Al_{0.7}Ga_{0.3})_{0.5}In_{0.5}P$ layer with a thickness of 60 Å. A multi-quantum barrier (MQB) layer 1800 is made of $Ga_{0.5}In_{0.5}P$ quantum well layers with a thickness of 14 Å and $(Al_{0.7}Ga_{0.3})_{0.5}In_{0.5}P$ quantum barrier layers with a thickness of 14 Å. A second spacer layer 1805b is made of an $(Al_{0.7}Ga_{0.3})_{0.5}In_{0.5}P$ layer with a thickness of 60 Å.

The multi-quantum barrier (MQB) layer 1800 is provided for the purpose of forming a virtual barrier against injected electrons. The total thickness of the first spacer layer 1805a, the multi-quantum barrier (MQB) layer 1800, and the second spacer layer 1805b is 260 Å. The first spacer layer 1805a and the second spacer layer 1805b are provided so as to prevent electrons from flowing through the multi-quantum barrier (MQB) layer 1800 due to a tunneling effect.

The above-mentioned structure allows the barrier in a conduction band against the injected electrons to increase by 100 meV, so that the electrons can be prevented from flowing from the active layer 1802 to the saturable absorbing layer 1801. Due to the presence of the multi-quantum barrier layer 1800, the light confinement factor of the saturable absorbing layer 1801 increases by 1%, compared with a spacer layer with a thickness of 260 Å not having a multi-quantum barrier layer.

As described above, the ratio of light distributed (light confinement factor) in the saturable absorbing layer 1801 increases as the spacer layers between the saturable absorbing layer 1801 and the active layer 1802 becomes thinner, in other words, as the interval between the saturable absorbing layer 1801 and the active layer 1802 becomes smaller. However, when this interval is too small, the electron density of the saturable absorbing layer 1801 increases due to the electrons injected from the active layer 1802, making it impossible to realize self-sustained pulsation.

As described above, in the present example, the multi-quantum barrier (MQB) is inserted between the spacer layer and the saturable absorbing layer. A multi-quantum barrier has its effective barrier height between the active layer and the spacer layer increased due to the interference effect by the wave of electrons overflowing the active layer. Therefore, the electrons injected into the saturable absorbing layer decrease.

There is an advantage in that the light confinement factor of the saturable absorbing layer increases by providing super lattice, such as a multi-quantum barrier, in the vicinity of the saturable absorbing layer. Thus, according to the structure of the present example, the light confinement factor of the saturable absorbing layer is increased and the electrons are prevented from being injected into the saturable absorbing layer due to the multi-quantum barrier by making the spacer layer thinner. This enables self-sustained pulsation to be easily realized.

EXAMPLE 5

When a saturable absorbing layer is present outside of a current path containing a current injection region of an active layer, carriers injected into the saturable absorbing layer diffuse in the saturable absorbing layer in the direction parallel with a substrate. This lengthens the carrier lifetime of the saturable absorbing layer, making it difficult to realize self-sustained pulsation. Thus, it is desirable that a portion of the saturable absorbing layer positioned outside of the current path is selectively removed.

Hereinafter, a method for selectively removing a part of the saturable absorbing layer will be described by illustrating the case where the saturable absorbing layer is made of GaInP mixed crystal, and a cladding layer and a spacer layer are made of AlGaInP mixed crystal.

As an example of a method for removing a part of the saturable absorbing layer positioned outside of the current path, an etching mask made of $SiO_2$ or the like is formed above a current injection region, and regions of a cladding layer and the saturable absorbing layer provided under the cladding layer which are not masked are removed by wet etching with a sulfuric acid type solution or by dry etching with a chlorine type gas. However, the interval between the saturable absorbing layer and the active layer is very small, i.e., on the order of hundreds of angstroms. Therefore, there is a possibility that excess etching is caused during the step of etching the saturable absorbing layer or the active layer is damaged during water washing and transportation in air after the etching step, remarkably degrading device characteristics. In order to avoid such inconveniences, in a metalorganic vapor phase growth method, a metalorganic molecular beam growth method, etc., the saturable absorbing layer of the device in a reaction chamber is etched with gas having an etching effect with respect to mixed crystal forming the saturable absorbing layer, such as arsine, and then, a diffusion blocking layer is grown in the reaction chamber.

A method for etching a saturable absorbing layer 1906 suitable for the present invention will be described with reference to FIGS. 25A through 25E.

Figure 25A:
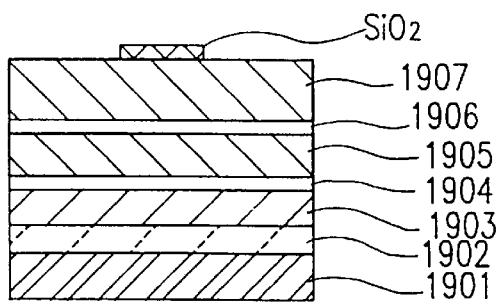
FIGS. 25A through 25E are cross-sectional views showing the steps of producing a semiconductor laser device in the fifth example according to the present invention.

Referring to FIG. 25A, a Si-doped n-type GaAs buffer layer 1902, a Si-doped n-type AlGaInP cladding layer 1903, a strained multi-quantum well active layer 1904, a Zn-doped p-type AlGaInP spacer layer 1905, a p-type GaInP saturable absorbing layer 1906, and a Zn-doped p-type AlGaInP cladding layer 1907 are formed in this order on an n-type GaAS substrate 1901. Thereafter, a $SiO_2$ mask is selectively formed on a current injection region of this layer structure.

Figure 25B:
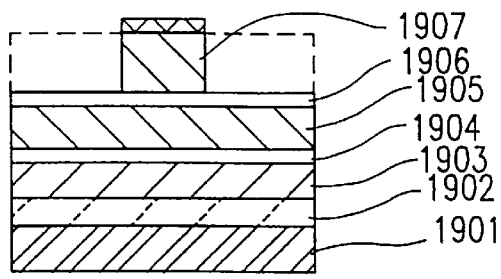

Next, as shown in FIG. 25B, a region of the p-type AlGaInP cladding layer 1907 which is not covered with the $SiO_2$ mask is selectively etched with a sulfuric acid solution, so that the p-type AlGaInP cladding layer 1907 is patterned into a stripe shape.

Figure 25C:
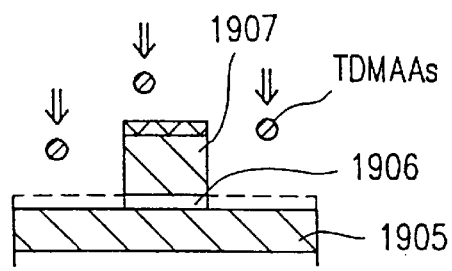

The substrate 1901 with the layer structure formed thereon is placed in a reaction tube of metalorganic vapor phase growth apparatus. Then, arsine is introduced into the reaction tube in an amount of 1000 cc per minute in an atmosphere of hydrogen under a pressure of 76 Torr, and the substrate 1901 is heated to 600° C. As shown in FIG. 25C, the saturable absorbing layer 1906 is etched. The etching rate of the GaInP saturable absorbing layer 1906 under this condition is 5 µm per hour. Thus, in order to remove the 5 nm of the saturable absorbing layer 1906, etching for 3.6 seconds is required.

Figure 25D:
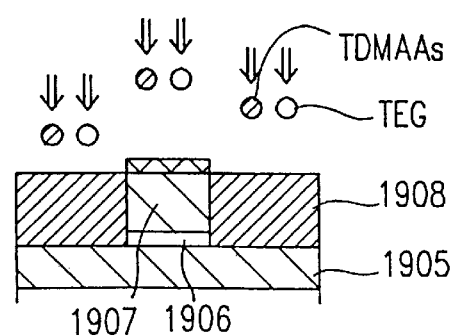

Next, as shown in FIG. 25D, arsine, triethylgallium (TMGa), and silane gas ($SiH_4$) as an n-type dopant are introduced into the reaction tube, whereby the n-type GaAa layer 1908 working as a carrier diffusion blocking layer and a current blocking layer is selectively epitaxially grown.

According to this method, a part of the saturable absorbing layer is selectively removed and the diffusion blocking layer can be formed, without damaging the active layer.

Figure 25E:
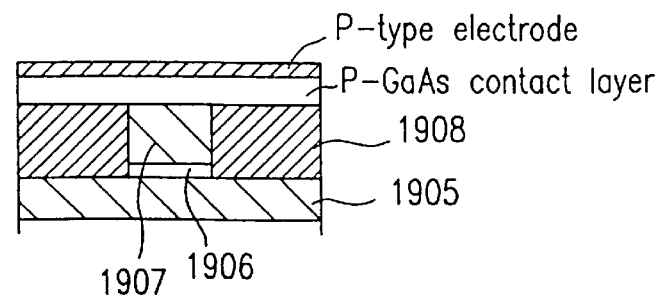

Thereafter, as shown in FIG. 25E, a p-type GaAs contact layer and a p-type electrode are formed in this order.

As described above, according to the present example, a part of the saturable absorbing layer can be selectively removed without damaging the active layer, and the n-type GaAs layer can be used as a current blocking layer. Therefore, a semiconductor laser device with a small aspect ratio and the diffusion of a current suppressed can be realized.

EXAMPLE 6

When a saturable absorbing layer doped in a high concentration is provided in the vicinity of an active layer of a semiconductor laser device, a dopant in a high concentration diffuses in a solid phase during epitaxial growth of semiconductor multi-layer films to reach the active layer. This causes defects which may diffuse, adversely affecting the reliability of the laser device. As described above, according to the present invention, it is indispensable that the saturable absorbing layer is doped with an impurity in a high concentration. Therefore, studies were conducted on the decrease in production yield and degradation of device characteristics due to the diffusion of the impurity from the saturable absorbing layer.

It was found that by simultaneously adding Si which is an n-type dopant with Zn which is a p-type dopant to a GaInP saturable absorbing layer, Zn can be suppressed from diffusing, and semiconductor multi-layer films can be formed with good reproducibility without disturbing a desired carrier concentration profile (see Japanese Patent Application No. 4-156522).

For the purpose of utilizing the above effect, a semiconductor laser device was produced with the following structure in which a saturable absorbing layer is simultaneously doped with p-type and n-type dopants. The sixth example of the present invention will be described.

Figure 26:
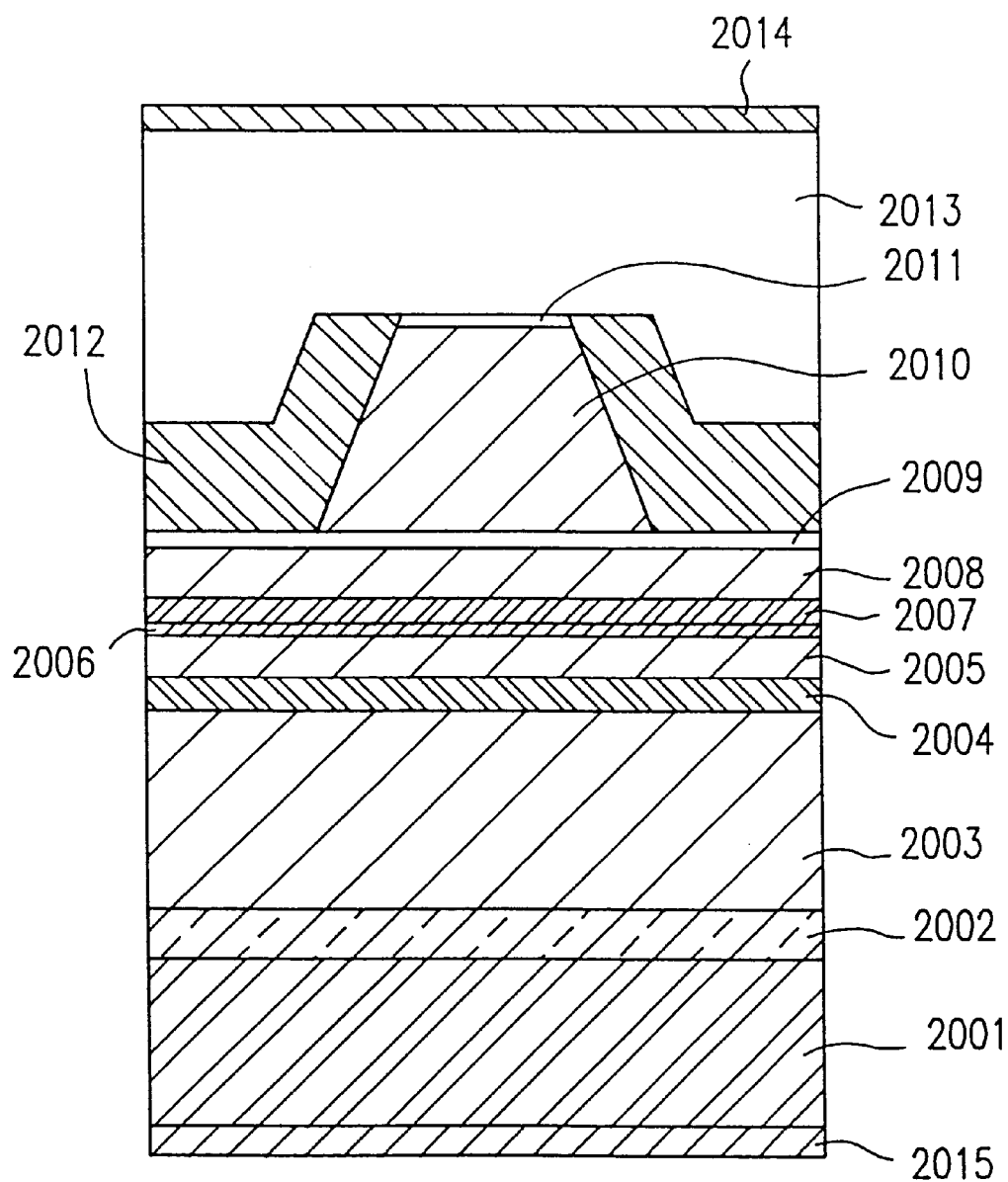
FIG. 26 is a cross-sectional view of an AlGaInP type semiconductor laser device in the sixth example according to the present invention.

Referring to FIG. 26, the sixth example of a semiconductor laser device of the present invention will be described.

A substrate 2001 is an n-type GaAs substrate having a principal plane tilted by 9° in a [011] direction from a (100) plane. A buffer layer 2002 made of Si-doped n-type GaAs, a cladding layer 2003 made of Si-doped n-type AlGaInP, a strained multi-quantum well active layer 2004, a spacer layer 2005 made of Zn-doped p-type AlGaInP, a strained quantum well saturable absorbing layer 2006 made of Zn- and Si-doped p-type GaInP, an optical guide layer 2007 made of Zn-doped p-type AlGaInP, a first p-type cladding layer 2008 made of Zn-doped p-type AlGaInP, and an etching stopping layer 2009 made of Zn-doped p-type GaInP are formed on the substrate 2001 in this order.

A ridge-shaped second p-type cladding layer 2010 made of Zn-doped p-type AlGaInP and a contact layer 2011 made of Zn-doped p-type GaInP are formed on the etching stopping layer 2009. Both sides of the ridge-shaped second p-type cladding layer 2010 and the contact layer 2011 are covered with a current blocking layer 2012 made of Si-doped n-type GaAs. Furthermore, a cap layer 2013 made of Zn-doped p-type GaAs is formed on the contact layer 2011 and the current blocking layer 2012. A p-type electrode 2014 and an n-type electrode 2015 are formed on the cap layer 2013 and the reverse surface of the substrate 2001, respectively.

The structural diagram of the semiconductor laser device of the present example is the same as that of FIG. 12. The strained multi-quantum well active layer 2004 includes 3 strained quantum wells with a thickness of 5 nm. The optical guide layer 2007 of the strained quantum well saturable absorbing layer 2006 has a mole fraction x of 0.5 and a thickness of 150 nm.

The present example is different from the above-mentioned example in that the carrier concentration of the strained quantum well saturable absorbing layer 2006 is set to be a desired level by simultaneously adding a p-type dopant and an n-type dopant to the strained quantum well saturable absorbing layer 2006. In this case, the added amounts of Zn and Si are precisely regulated in such a manner that the carrier concentration of the strained quantum well saturable absorbing layer 2006 is $2 \times 10^{18}$ cm$^{-3}$.

In the semiconductor laser device produced by the method of the present example, the self-sustained pulsation phenomenon is realized which is similar to that obtained from the one which is not simultaneously doped with two kinds of dopants, and an RIN of −130 dB/Hz or less is obtained. Furthermore, the production yield of the semiconductor laser device realizing self-sustained pulsation is substantially improved from 5% to 50%, and the assumed lifetime is improved from 5000 hours to 20000 hours. Thus, the semiconductor laser device is obtained which has no problems for practical use.

In the present example, Zn doped in a high concentration is suppressed from diffusing by simultaneously adding a p-type dopant and an n-type dopant to the saturable absorbing layer. This does not allow the carrier concentration profile to greatly change from a desired value in the course of production and operation of the device. Therefore, various characteristics and production yield of the semiconductor laser device can be enhanced.

In the present example, Zn and Si are used as dopants. However, dopants to be used are not limited thereto. Mg or the like can be used as a p-type dopant, and Se or the like can be used as an n-type dopant.

EXAMPLE 7

In Example 6, the structure suitable for preventing the diffusion of a dopant from the saturable absorbing layer is described. In the present example, a semiconductor laser device will be described, which has a structure further capable of preventing the diffusion of a dopant from a current blocking layer.

In the case where a semiconductor layer is grown in the course of production of a semiconductor laser device, when a regrowth interface is present nearby, the diffusion of an impurity is accelerated through defects on the interface. Therefore, Zn is considered to cause problems during the formation of a buried structure such as a current confinement layer to be provided after the formation of a GaInP saturable absorbing layer. Then, it was found that by simultaneously adding Si as an n-type dopant and Zn as a p-type dopant to a GaAs current blocking layer, Zn can be prevented from diffusing from the GaInP saturable absorbing layer and a semiconductor multi-layer films can be formed with good reproducibility without disturbing a desired carrier concentration profile. For the purpose of utilizing the above effect, a semiconductor laser device was produced with the following structure in which a saturable absorbing layer is simultaneously doped with p-type and n-type dopants.

Figure 27:
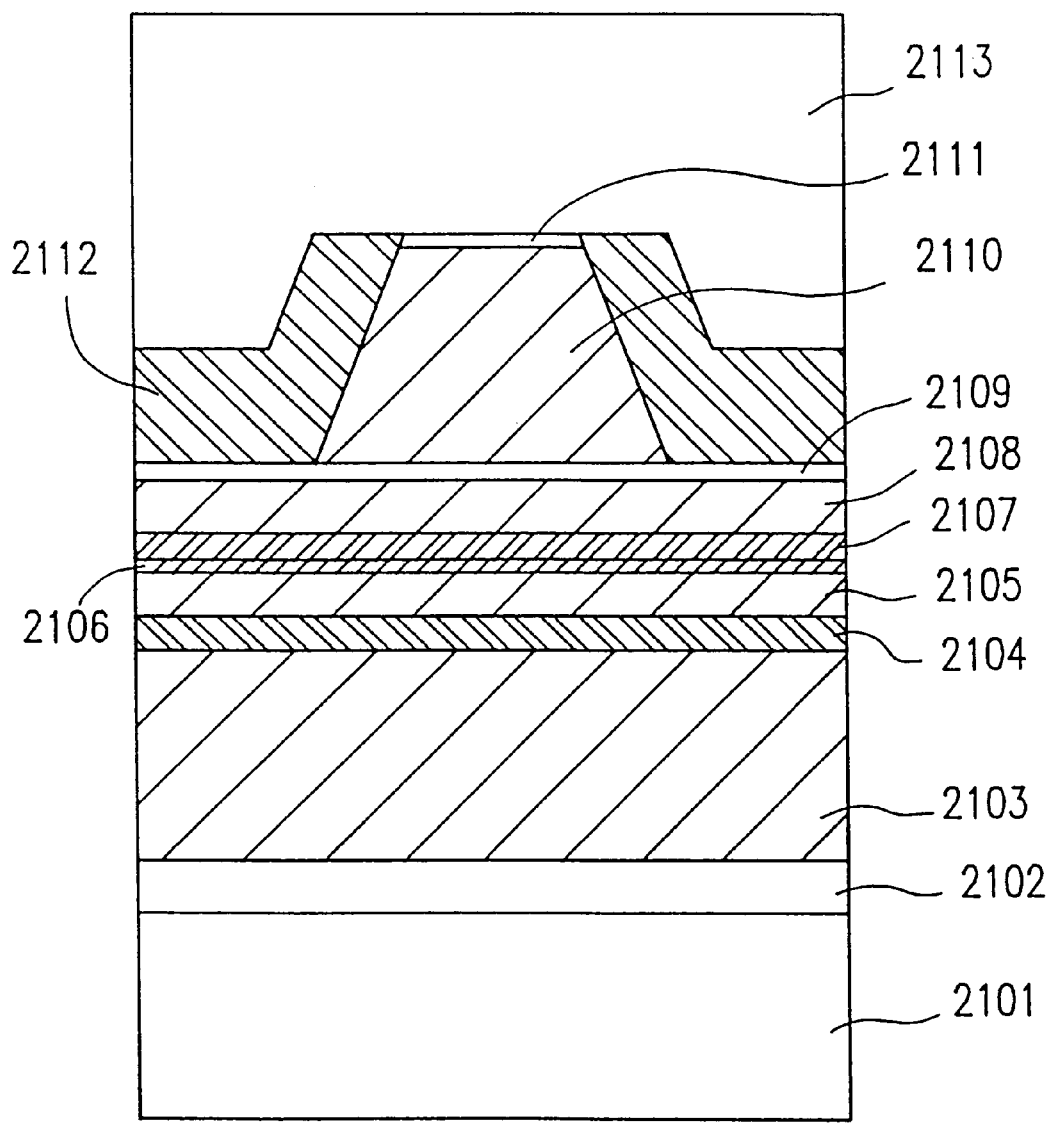
FIG. 27 is a cross-sectional view of an AlGaInP type semiconductor laser device in the seventh example according to the present invention.

Referring to FIG. 27, the seventh example of a semiconductor laser device of the present invention will be described.

A substrate 2101 is an n-type GaAs substrate having a plane tilted by 9° in a [011] direction from a (100) plane. A buffer layer 2102 made of Si-doped n-type GaAs, a cladding layer 2103 made of Si-doped n-type AlGaInP, a strained multi-quantum well active layer 2104, a spacer layer 2105 made of Zn-doped p-type AlGaInP, a strained quantum well saturable absorbing layer 2106 made of Zn- and Si-doped p-type GaInP, an optical guide layer 2107 made of Zn-doped p-type AlGaInP, a first p-type cladding layer 2108 made of Zn-doped p-type AlGaInP, and an etching stopping layer 2109 made of Zn-doped p-type GaInP are formed on the substrate 2101 in this order.

A ridge-shaped second p-type cladding layer 2110 made of Zn-doped p-type AlGaInP and a contact layer 2111 made of Zn-doped p-type GaInP are formed on the etching stopping layer 2109. Both sides of the ridge-shaped second p-type cladding layer 2110 and the contact layer 2111 are covered with a current blocking layer 2112 made of Si- and Zn-doped n-type GaAs.

Furthermore, a cap layer 2113 made of Zn-doped p-type GaAs is formed on the contact layer 2111 and the current blocking layer 2112. A p-type electrode 2114 and an n-type electrode 2115 are formed on the cap layer 2113 and the reverse surface of the substrate 2101, respectively.

The structural diagram of the semiconductor laser device of the present example is the same as that of FIG. 12. The strained multi-quantum well active layer 2104 includes 3 strained quantum wells with a thickness of 5 nm. The optical guide layer 2107 of the strained quantum well saturable absorbing layer 2106 has a mole fraction x of 0.5 and a thickness of 150 nm.

The present example is different from the above-mentioned example in that the carrier concentration of the current blocking layer 2112 is set to be a desired level by simultaneously adding an n-type dopant and a p-type dopant thereto. In this case, the added amounts of Si and Zn are precisely regulated in such a manner that the carrier concentration of the current blocking layer 2112 is $3 \times 10^{18}$ cm$^{-3}$.

In the semiconductor laser device produced by the method of the present example, the self-sustained pulsation phenomenon is realized which is similar to that obtained from the one which is not simultaneously doped with two kinds of dopants, and an RIN of −130 dB/Hz or less is obtained. Furthermore, the production yield of the semiconductor laser device realizing self-sustained pulsation is substantially improved from 5% to 60%, and the assumed lifetime is improved from 5000 hours to 40000 hours. Thus, the semiconductor laser device is obtained which has no problems for practical use.

In the present example, Zn which the strained quantum well saturable absorbing layer is doped with in a high concentration, is suppressed from diffusing by simultaneously adding an n-type dopant and a p-type dopant to the current confinement layer. This does not allow the carrier concentration profile to change, so that various characteristics and production yield of the semiconductor laser device are effectively enhanced.

In the present example, the strained quantum well saturable absorbing layer and the current blocking layer are simultaneously doped with two kinds of impurities. However, the same effect can also be expected even when only the current blocking layer is simultaneously doped with two kinds of impurities.

In the present example, Zn and Si are used as dopants. However, dopants to be used are not limited thereto. Mg or the like can be used as a p-type dopant, and Se or the like can be used as an n-type dopant.

EXAMPLE 8

Hereinafter, a chip inspection step according to the present invention will be described.

In general, a plurality of semiconductor laser devices are formed from one semiconductor wafer. More specifically, a semiconductor wafer substrate is cleaved after forming a p-type electrode and an n-type electrode on a semiconductor wafer so as to obtain a plurality of bars. Thereafter, the cleaved face of each bar is coated with a reflective film.

Semiconductor laser devices determined to have characteristics outside of a predetermined range during the chip inspecting step are excluded as defected products. For example, semiconductor laser devices in the form of a bar are excluded as defect products, when their threshold current is not in the range of 100 to 200 mA while being driven with a pulse at room temperature.

Next, laser chips are obtained from the bars which have not been excluded during the chip inspection step. These laser chips are sealed in cans for the purpose of conducting an assembly step.

Then, an aging step is conducted. The inventors found that in the case of semiconductor laser devices having a saturable absorbing layer doped with a p-type impurity, the characteristics of the laser devices at the commencement of laser oscillation change after a lapse of one minute or longer. They also found that the characteristics tend to be stabilized after a lapse of several minutes following the commencement of laser oscillation. More specifically, the characteristics come to maintain an almost constant state after a lapse of about 10 minutes following the commencement of laser oscillation. For example, in the case where a semiconductor laser device is driven under the condition of obtaining a predetermined light output, in spite of the fact that the laser device operates at a driving current of about 100 mA immediately after the commencement of laser oscillation, laser devices sometimes come to operate at a driving current of about 70 mA after a lapse of 1 to 10 minutes.

The above-mentioned changes in characteristics are caused within a relatively short period of time after the commencement of laser oscillation, but not caused after a lapse of the period of time. For this reason, such changes in characteristics will be referred to as "initial changes in characteristics".

In the case of using devices and systems including semiconductor laser devices as light sources, it is preferable that the driving current of the semiconductor laser devices does not change. Because of this, the semiconductor laser devices of the present invention are preferably subjected to the step of stabilizing the characteristics such as a threshold current (aging step) before being delivered. During the aging step, semiconductor laser devices in the form of a chip can be allowed to realize continuous laser oscillation at room temperature for 1 to 120 minutes, or can be allowed to realize pulse oscillation at 50° C. for 1 to 120 minutes. These steps are required to be conducted before assembly of chips.

It was also found that the characteristics of laser devices can be stabilized by subjecting wafers to annealing at 300° C. to 800° C. for about 10 to 60 minutes before separating the wafers into a plurality of bars, in place of conducting the aging step. The characteristics of the semiconductor laser devices can be stabilized by annealing in the state of wafers before assembly. This enables defected products to be excluded by inspection before assembly, avoiding the waste such as assembly of defected devices. Furthermore, semiconductor laser devices are not required to be treated, separately, and therefore, a plurality of semiconductor laser devices can be simultaneously treated. Annealing for stabilizing the characteristics can be conducted after wafers are separated into laser bars.

The above-mentioned aging step and annealing exert preferable effects in the case where saturable absorbing layers are doped with a p-type impurity (particularly Zn) in a high concentration.

In any of the above-mentioned examples, AlGaInP type semiconductor laser devices have been described. However, the present invention is not limited thereto. For example, the present invention can be applied to $Al_xGa_{1-x}As$ ($0 \leq x \leq 1$) type, $Al_xGa_yIn_{1-x-y}N$ ($0 \leq x \leq 1$, $0 \leq y \leq 1$) type, or $Mg_xZn_{1-x}S_ySe_{1-y}$ ($0 \leq x \leq 1$, $0 \leq y \leq 1$) type. Whichever type material is used, stable self-sustained pulsation can be realized as long as a saturable absorbing layer is doped with an impurity in a concentration of $1 \times 10^{18}$ cm$^{-3}$ or more.

In the case of $Al_xGa_{1-x}As$ ($0 \leq x \leq 1$) type semiconductor laser devices, for example, an active layer is made of $Al_{0.1}Ga_{0.9}As$, a saturable absorbing layer is made of GaAs, and a cladding layer is made of AlGaAs.

In the case of $Al_xGa_yIn_{1-x-y}N$ ($0 \leq x \leq 1$, $0 \leq y \leq 1$) type semiconductor laser devices, for example, an active layer is made of $In_{0.05}Ga_{0.95}N$, a saturable absorbing layer is made of $In_{0.2}Ga_{0.8}N$, and a cladding layer is made of $Al_{0.1}Ga_{0.9}N$.

In the case of $Mg_xZn_{1-x}S_ySe_{1-y}$ ($0 \leq x \leq 1$, $0 \leq y \leq 1$) type semiconductor laser devices, for example, an active layer is made of $Cd_{0.2}Zn_{0.8}Se$, a saturable absorbing layer is made of $Cd_{0.3}Zn_{0.7}Se$, and a cladding layer is made of $Mg_{0.1}Zn_{0.9}S_{0.1}Se_{0.9}$.

EXAMPLE 9

Figure 28:
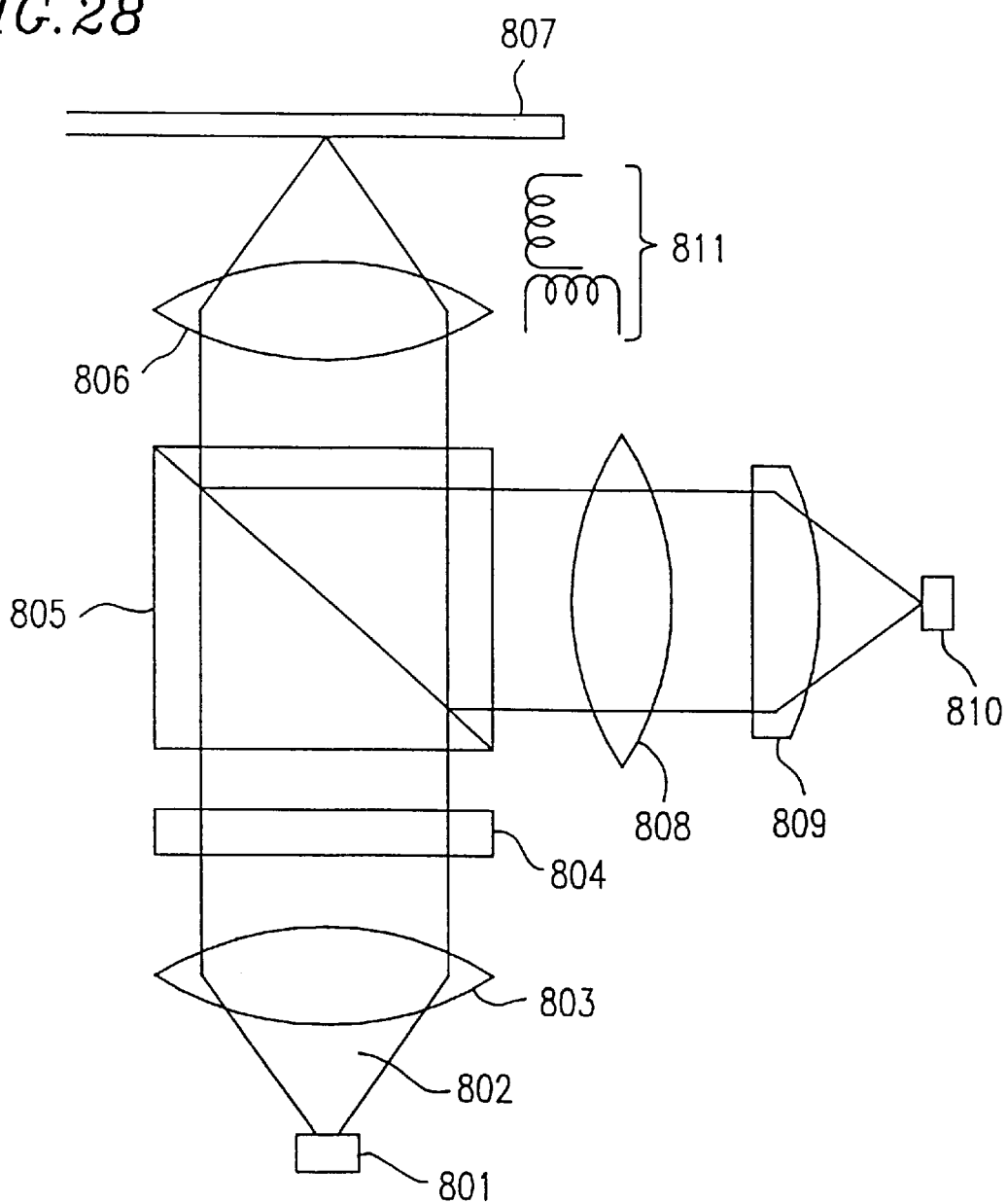
FIG. 28 is a schematic view showing a structure of an example of an optical disk apparatus according to the present invention.

Hereinafter, an optical disk apparatus of the present invention will be described with reference to FIG. 28.

The optical disk apparatus includes a semiconductor laser device 801 of the present invention, a collimator lens 803 collimating laser light (wavelength: 650 nm) emitted from the semiconductor laser device 801, a diffraction grating 804 splitting the parallel light into 3 laser light beams (in this figure, only one laser beam is shown), a half prism 805 transmitting/reflecting a specific component of laser light, and a collective lens 806 focusing the laser light from the half prism 805 onto an optical disk 807. A laser beam spot with a diameter of about 1 μm, for example, is formed on the optical disk 807. As the optical disk 807, rewritable as well as read-only disks can be used.

The laser light reflected from the optical disk 807 passes through a light receiving lens 808 and a cylindrical lens 809 after being reflected from the half prism 805 and is incident upon a photoreceptor 810. The photoreceptor 810 has a photodiode divided into a plurality of pieces, and generates an information reproducing signal, a tracking signal, and a focus error signal based on the laser light reflected from the optical disk 807. A drive system 811 drives an optical system based on the tracking signal and the focus error signal, thereby adjusting the position of the laser beam spot on the optical disk 807.

In the optical disk apparatus, as constituent elements other than the semiconductor laser device 801, those which are known can be used. As described above, the semiconductor laser device 801 of the present example has a saturable absorbing layer doped in a high concentration. Because of this, even when a part of the laser light reflected from the optical disk 807 passes through the half prism 805 and the diffraction grating 804 to return to the semiconductor laser device 801, relative intensity noise can be maintained at a low level.

In the semiconductor laser device shown in FIG. 22, self-sustained pulsation is realized at up to a light output of about 10 mW. However, when the light output increases to exceed this level, an oscillation state gradually changes from self-sustained oscillation to single mode oscillation. For example, self-sustained pulsation is not realized at a light output of about 15 mW. While reproducing information recorded in an optical disk, a semiconductor laser device should not cause return light noise due to self-sustained pulsation. However, while recording information in an optical disk, self-sustained pulsation is not required to be realized. For example, when information is recorded at a light output of about 15 mW and reproduced at a light output of about 5 mW, low noise recording as well as low noise reproduction of information can be conducted.

As described above, in the optical disk apparatus of the present invention, low noise reproduction can be attained at wavelengths of 630 to 680 nm without using a circuit component for high frequency superimposing.

In contrast, the conventional AlGaInP type semiconductor laser devices operating at wavelengths of 630 to 680 nm cannot realize stable self-sustained pulsation. Therefore, in the case where the conventional AlGaInP type semiconductor laser device is used in the optical disk apparatus, it is required to suppress return light noise by superimposing a high frequency on a driving current. This requires a large-scale high frequency superimposing circuit, which is not conducive to miniaturization of the optical disk apparatus.

EXAMPLE 10

Hereinafter, another example of the optical disk apparatus according to the present invention will be described.

The optical disk apparatus uses a laser unit including the above-mentioned semiconductor laser device of the present invention. The laser unit includes a silicon substrate on which a photodiode is formed and a semiconductor laser device mounted thereon. Furthermore, a micromirror for reflecting laser light emitted from the semiconductor laser device is formed on the silicon substrate.

Figure 29:
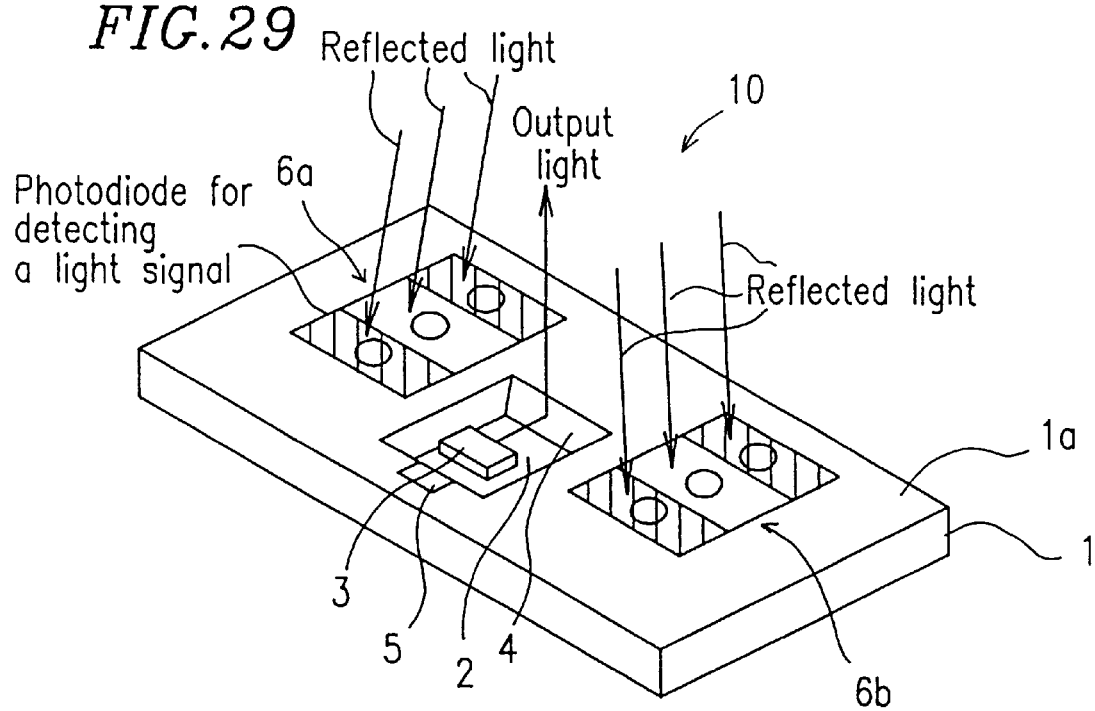
FIG. 29 is a perspective view of a laser unit used in the optical disk apparatus according to the present invention.

The laser unit will be described with reference to FIG. 29. As shown in FIG. 29, a concave portion 2 is formed at the center of a principal plane 1a of a silicon substrate (7 mm×35 mm) 1, and a semiconductor laser device 3 is provided on the bottom face of the concave portion 2. One side face of the concave portion 2 is angled so as to function as a micromirror 4. In the case where the principal plane 1a of the silicon substrate 1 is a (100) plane, a (111) plane is exposed by anisotropic etching so as to be used as the micromirror 4. The (111) plane is tilted by 54° from the (100) plane. Therefore, when an off-substrate is used in which the principal plane 1a is tilted by 9° from the (100) plane in the <110> direction, a (111) plane tilted by 45° with respect to the principal plane 1a can be obtained. The (111) plane provided at a position opposing the (111) plane is tilted by 63° with respect to the principal plane 1a. The micromirror 4 is not formed on this plane, but a photodiode 5 for monitoring a light output, as described later, is formed thereon. The (111) plane formed by anisotropic etching is a smooth mirror plane, so that it functions as the outstanding micromirror 4. However, in order to enhance a reflecting efficiency of the micromirror 4, a metal film which is not likely to absorb laser light is preferably vapor-deposited on the tilted face of the silicon substrate 1.

In addition to the photodiode 5 for monitoring a light output of the semiconductor laser device 3, 5-way divided photodiodes 6a and 6b for detecting a light signal are formed on the silicon substrate 1.

Figure 30:
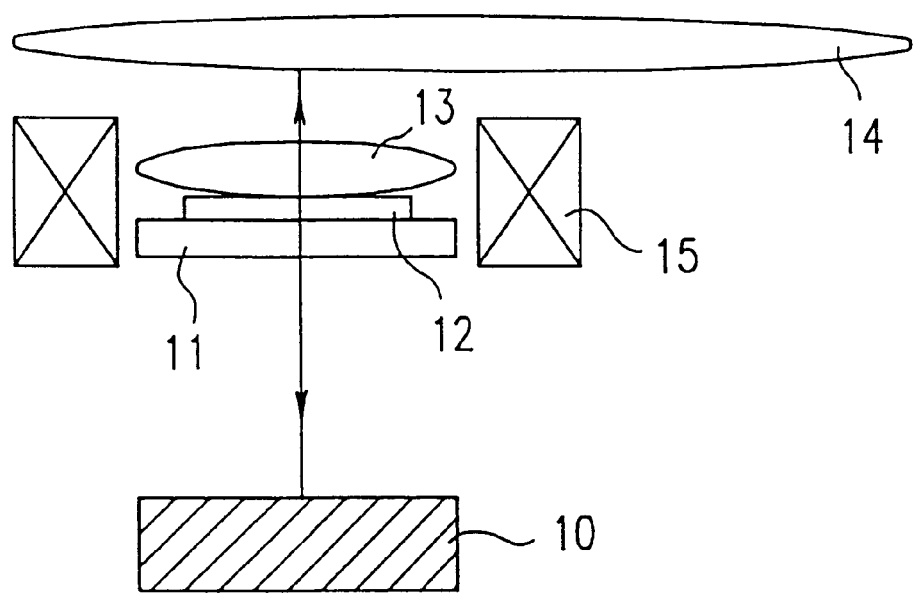
FIG. 30 is a schematic view showing a structure of another example of an optical disk apparatus according to the present invention.
Figure 31:
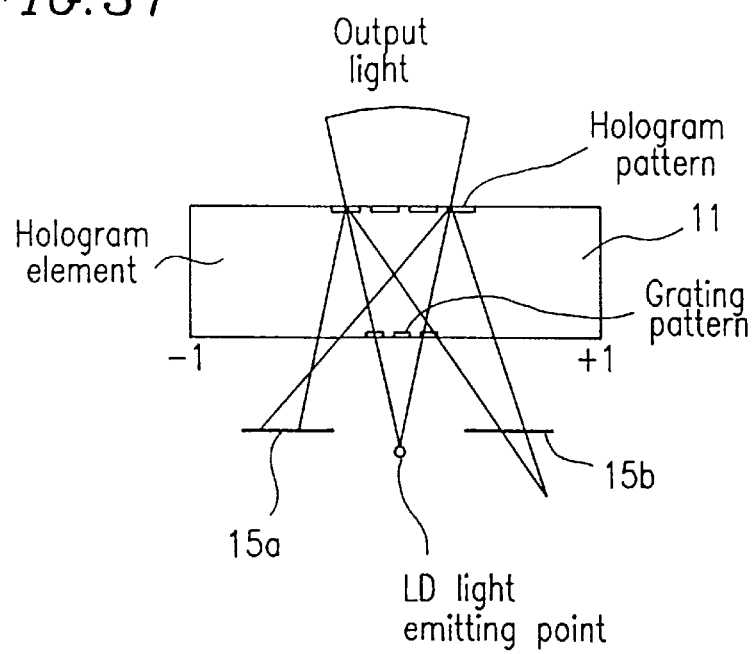
FIG. 31 is a diagram showing the function of a hologram device used in examples of the optical disk apparatus according to the present invention.

Referring to FIG. 30, an optical disk apparatus of the present example will be described. Laser light emitted from a semiconductor laser device (not shown in FIG. 30) of the laser unit 10 having the above-described structure is reflected from a micromirror (not shown in FIG. 30) and is split into 3 light beams (in this figure, only one light beam is shown for simplicity) by a grating formed on the lower face of a hologram element 11. Thereafter, the laser light passes through a quarter-wave plate (¼ λ plate) 12 and an objective lens 13 and is focused onto an optical disk 14. The laser light reflected from the optical disk 14 passes through the objective lens 13 and the ¼ λ plate 12 and is diffracted by a grating formed on the upper face of the hologram element 11. This diffraction allows minus first-order light and plus first-order light to be formed, as shown in FIG. 31. For example, the minus first-order light is radiated to a light-receiving region 15a positioned on the left side of the figure and the plus first-order light is radiated to a light-receiving region 15b positioned on the right side of the figure. The pattern of the grating formed on the upper face of the hologram element 11 is adjusted so that the focal length of the minus first-order light is different from that of the plus first-order light.

Figure 32:
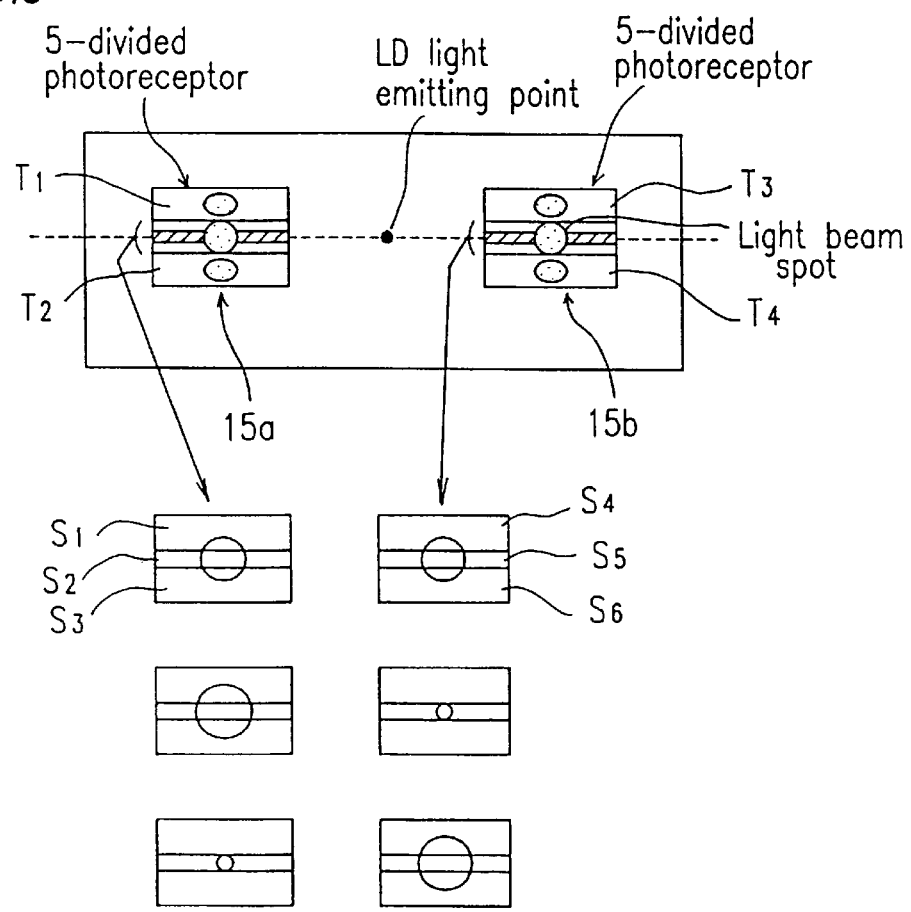
FIG. 32 is a plan view of a light detector used in the examples of the optical disk apparatus according to the present invention.

As shown in FIG. 32, when laser light is focused on the optical disk, the shape of a reflected laser light beam spot formed on the light-receiving region 15a of the laser unit 10 becomes equal to that formed on the light-receiving region 15b. When laser light is not focused on the optical disk, the shape of a reflected laser light beam spot formed on the light-receiving region 15a of the laser unit 10 becomes different from that formed on the light-receiving region 15b.

The size of light beam spots formed on the right and left light-receiving regions are detected as a focus error signal (FES) as follows:

$$FES=(S1+S3+S5)-(S2+S4+S6)$$

where S1 to S3 denote the intensity of a signal output from central 3 photodiodes of 5 photodiodes forming the light-receiving region 15a, and S4 to S6 denote the intensity of a signal output from central 3 photodiodes of 5 photodiodes forming the light-receiving region 15b. When the focus error signal (FES) is zero, laser light is focused on the optical disk. An actuator 15 shown in FIG. 30 drives the objective lens 13 so that the focus error signal (FES) becomes zero.

A tracking error signal (TES) is obtained as follows:

$$TES=(T1-T2)+(T3-T4)$$

where T1 and T2 denote the intensity of a signal output from 2 photodiodes on both sides of 5 photodiodes forming the light-receiving region 15a, and T3 to T4 denote the intensity of a signal output from 2 photodiodes on both sides of 5 photodiodes forming the light-receiving region 15b.

An information signal (RES) is obtained as follows:

RES=(S1+S3+S5)+(S2+S4+S6)

In the present example, the laser unit in which the semiconductor laser device is integrated with the photodiode is used. However, the semiconductor laser device can be separated from the photodiode.

As described above, the optical disk apparatus is miniaturized by using a laser unit in which a semiconductor laser device is integrated with photodiodes. Furthermore, since the photodiodes and the micromirror are previously formed on the silicon substrate, optical alignment can be conducted merely by aligning a semiconductor laser device with the silicon substrate. In this manner, optical alignment is so easy that assembly precision is enhanced and a production process is simplified.

INDUSTRIAL APPLICABILITY

As described above, according to the present invention, the semiconductor laser device is provided in which the carrier lifetime is controlled and stable self-sustained pulsation characteristics are realized by increasing the doping level of a saturable absorbing layer.

Furthermore, the semiconductor laser device of the present invention enables self-sustained pulsation characteristics to be realized with a higher output by applying a quantum well to an active layer and using a quantum well saturable absorbing layer provided with an optical guide layer.

Furthermore, the semiconductor laser device of the present invention enables self-sustained pulsation to be easily realized by providing a highly doped saturable absorbing region adjacent to a current injection region of an active layer.

Furthermore, according to the present invention, the injection of electrons into a saturable absorbing layer is suppressed and the light confinement factor of the saturable absorbing layer is increased by providing a multi-quantum barrier layer in a spacer layer, whereby self-sustained pulsation is easily realized.

Furthermore, according to the present invention, the diffusion of dopants is suppressed so as not to change the carrier concentration profile by simultaneously adding an n-type dopant and a p-type dopant to a saturable absorbing layer and a current confinement layer. Therefore, the present invention is very effective in terms of the enhancement of various characteristics and production yield of semiconductor laser devices.

What is claimed is:

1. A self-sustained pulsation type semiconductor laser device, comprising an active layer and a cladding structure sandwiching the active layer, wherein the cladding structure includes a saturable absorbing layer, a spacer layer having a bandgap larger than that of the active layer is provided between the active layer and the saturable absorbing layer, and an optical guide layer having a bandgap smaller than that of the spacer layer is provided so that at least the spacer layer is disposed between the optical guide layer and the active layer.

2. A self-sustained pulsation type semiconductor laser device according to claim 1, wherein the optical guide layer is provided adjacent to the saturable absorbing layer.

3. A self-sustained pulsation type semiconductor laser device according to claim 1, wherein the bandgap of the optical guide layer is larger than that of the saturable absorbing layer.

4. A self-sustained pulsation type semiconductor laser device according to claim 1, wherein the optical guide layer has a refractive index larger than that of the spacer layer.

5. A self-sustained pulsation type semiconductor laser device according to claim 1, wherein a light confinement factor of the saturable absorbing layer is set to be about 1.5% or more.

6. An optical disk apparatus comprising;

a semiconductor laser device;

a converging optical system for converging laser light emitted from the semiconductor laser device onto a recording medium; and a light detector for detecting laser light reflected from the recording medium, wherein the semiconductor laser device is a self-sustained pulsation type semiconductor laser device which comprises an active layer and a cladding structure sandwiching the active layer, wherein the cladding structure includes a saturable absorbing layer; a spacer layer having a bandgap larger than that of the active layer is provided between the active layer and the saturable absorbing layer; and an optical guide layer having a bandgap smaller than that of the spacer layer is provided so that at least the spacer layer is disposed between the optical guide layer and the active layer.

* * * * *